United States Patent
Rho et al.

(10) Patent No.: US 10,784,184 B2
(45) Date of Patent: Sep. 22, 2020

(54) SEMICONDUCTOR DEVICE INCLUDING THROUGH SILICON VIAS DISTRIBUTING CURRENT

(71) Applicant: Samsung Electronics Co., Ltd., Suwon-si, Gyeonggi-do (KR)

(72) Inventors: Soojung Rho, Gyeonggi-do (KR); Chisung Oh, Suwon-si (KR); Kyomin Sohn, Yongin-si (KR); Yong-Ki Kim, Suwon-si (KR); Jong-Ho Moon, Hwaseong-si (KR); SeungHan Woo, Seoul (KR); Jaeyoun Youn, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/263,408

(22) Filed: Jan. 31, 2019

(65) Prior Publication Data
US 2019/0237390 A1   Aug. 1, 2019

(30) Foreign Application Priority Data

Jan. 31, 2018   (KR) .................. 10-2018-0012102

(51) Int. Cl.
*H01L 23/48*   (2006.01)
*H01L 23/538*   (2006.01)
*H01L 23/528*   (2006.01)
*H01L 23/522*   (2006.01)
*H01L 25/065*   (2006.01)

(52) U.S. Cl.
CPC ........ *H01L 23/481* (2013.01); *H01L 23/5226* (2013.01); *H01L 23/5286* (2013.01); *H01L 23/5386* (2013.01); *H01L 25/0657* (2013.01); *H01L 2225/06513* (2013.01); *H01L 2225/06541* (2013.01); *H01L 2225/06544* (2013.01)

(58) Field of Classification Search
CPC ............. H01L 23/481; H01L 25/0657; H01L 23/5226; H01L 23/5286; H01L 23/5386; H01L 2225/06544; H01L 2225/06513; H01L 2225/06541
USPC ........................................................ 257/774
See application file for complete search history.

(56) References Cited

U.S. PATENT DOCUMENTS

| | | | | |
|---|---|---|---|---|
| 8,198,915 B2* | 6/2012 | Yoko | ......................... | G11C 5/02 326/101 |
| 8,304,863 B2 | 11/2012 | Filippi et al. | | |
| 8,492,905 B2* | 7/2013 | Suh | .......................... | G11C 5/00 257/777 |

(Continued)

OTHER PUBLICATIONS

Extended European Search Report dated Jul. 8, 2019 for corresponding application, EP 18212994.0.

*Primary Examiner* — Vu A Vu
(74) *Attorney, Agent, or Firm* — Lee IP Law, P.C.

(57) ABSTRACT

A semiconductor device includes first to M-th semiconductor dies stacked in a first direction. Each of the first to M-th semiconductor dies includes a substrate, first to K-th through silicon vias passing through the substrate in the first direction, and a first circuit to receive power through a power supply line electrically connected to the first through silicon via. Each of first to K-th through silicon vias of the N-th semiconductor die is electrically connected to a through silicon via of first to K-th through silicon vias of the (N+1)-th semiconductor die that is spaced apart therefrom in a plan view.

20 Claims, 11 Drawing Sheets

(56) References Cited

U.S. PATENT DOCUMENTS

| | | |
|---|---|---|
| 8,780,578 B2 | 7/2014 | Foster, Sr. et al. |
| 8,828,800 B2 | 9/2014 | Chang et al. |
| 9,153,299 B2 | 10/2015 | Stephens, Jr. |
| 9,305,909 B2 | 4/2016 | Ko |
| 2008/0150359 A1 | 6/2008 | Yamada |
| 2011/0079923 A1 | 4/2011 | Suh |
| 2011/0292742 A1 | 12/2011 | Oh et al. |
| 2012/0061821 A1 | 3/2012 | Black et al. |
| 2012/0267792 A1 | 10/2012 | Takayama et al. |
| 2012/0290996 A1 | 11/2012 | Law et al. |
| 2013/0024737 A1 | 1/2013 | Marinissen et al. |
| 2013/0043541 A1 | 2/2013 | Chen et al. |
| 2013/0161827 A1 | 6/2013 | Nakazawa et al. |
| 2013/0280863 A1 | 10/2013 | Suh |
| 2015/0179549 A1 | 6/2015 | Shibata et al. |
| 2015/0213860 A1 | 7/2015 | Narui et al. |
| 2015/0270250 A1 | 9/2015 | Takamitsu |
| 2016/0351551 A1 | 12/2016 | Mei et al. |
| 2017/0026036 A1 | 1/2017 | Chiyonobu et al. |
| 2017/0053900 A1 | 2/2017 | Kawaminami |

\* cited by examiner

SEMICONDUCTOR DEVICE INCLUDING THROUGH SILICON VIAS DISTRIBUTING CURRENT

CROSS-REFERENCE TO RELATED APPLICATIONS

Korean Patent Application No. 10-2018-0012102 filed on Jan. 31, 2018, in the Korean Intellectual Property Office, and entitled: "Semiconductor Device Including Through Silicon Vias Distributing Current," is incorporated by reference herein in its entirety.

BACKGROUND

1. Field

Embodiments relate to a semiconductor device, and more particularly, relate to a semiconductor device including through silicon vias distributing a current.

2. Description of the Related Art

Many semiconductor dies may be stacked in a semiconductor device. Generally, wire bonding may be used to electrically connect the stacked semiconductor dies. Through silicon vias may be used to connect the stacked semiconductor dies to realize high performing and highly integrated semiconductor devices.

The semiconductor device may be, for example, a memory device. To increase a capacity of the memory device, the number of memory dies stacked in the memory device may increase. As the number of memory dies increases, through silicon vias providing a supply voltage to the memory dies may increase.

SUMMARY

According to an exemplary embodiment, a semiconductor device includes first to M-th semiconductor dies stacked in a first direction. Each of the first to M-th semiconductor dies may include a substrate, first to K-th through silicon vias passing through the substrate in the first direction, and a first circuit to receive power through a power supply line electrically connected to the first through silicon via. Each of "M" and "K" may independently be an integer of 2 or more. An (N+1)-th semiconductor die of the first to M-th semiconductor dies may be stacked on an N-th semiconductor die of the first to M-th semiconductor dies. "N" may be an integer that is not less than 1 and is not more than (M−1). Each of first to K-th through silicon vias of the N-th semiconductor die may be electrically connected to a through silicon via of first to K-th through silicon vias of the (N+1)-th semiconductor die that is spaced apart therefrom in a plan view. First to K-th through silicon vias of the first semiconductor die may be connected to a power source supplying the power.

According to an exemplary embodiment, a semiconductor device may include first to M-th semiconductor dies stacked in a first direction. Each of the first to M-th semiconductor dies may include a substrate, first to K-th through silicon vias passing through the substrate in the first direction, first to S-th switches to select power supply lines electrically connected to the first to K-th through silicon vias, and a first circuit to receive power through one of the first to S-th switches. Each of "M", "K", and "S" may independently be an integer of 2 or more. An (N+1)-th semiconductor die of the first to M-th semiconductor dies may be stacked on an N-th semiconductor die of the first to M-th semiconductor dies. "N" may be an integer that is not less than 1 and is not more than (M−1). Each of first to K-th through silicon vias of the N-th semiconductor die may be electrically connected to a through silicon via of first to K-th through silicon vias of the (N+1)-th semiconductor die that is spaced apart therefrom in a plan view. First to K-th through silicon vias of the first semiconductor die may be connected to a power source supplying the power.

According to an exemplary embodiment, a semiconductor device may include first to M-th semiconductor dies stacked in a first direction. Each of the first to M-th semiconductor dies may include a substrate, first to a K-th through silicon vias passing through the substrate in the first direction, (K+1)-th to (K+L)-th through silicon vias passing through the substrate in the first direction, and a first circuit to receive a voltage and a current through a power supply line electrically connected to the first to K-th through silicon vias. Each of "M", "K", and "L" may independently be an integer of 2 or more. An (O+1)-th semiconductor die of the first to M-th semiconductor dies may be stacked on an O-th semiconductor die of the first to M-th semiconductor dies. "O" may be an integer that is not less than 1 and is not more than (M−1). First to K-th through silicon vias of the O-th semiconductor die may be electrically connected to (K+1)-th to (K+L) through silicon vias of the (O+1)-th semiconductor die that are spaced apart therefrom in a plan view. The (K+1)-th to (K+L)-th through silicon vias of the O-th semiconductor die may be electrically connected to first to K-th through silicon vias of the (O+1)-th semiconductor die that are spaced apart therefrom in the plan view. An (N+1)-th semiconductor die of the first to M-th semiconductor dies may be stacked on an N-th semiconductor die of the first to M-th semiconductor dies. "N" may be an integer that is not less than 1 and is not more than (M−1) and may be different from "O". Each of first to (K+L)-th through silicon vias of the N-th semiconductor die may be electrically connected to an overlapping through silicon via of first to K-th through silicon vias of the (N+1)-th semiconductor die in the plan view. First to (K+L)-th through silicon vias of the first semiconductor die are connected to a power source supplying the power.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
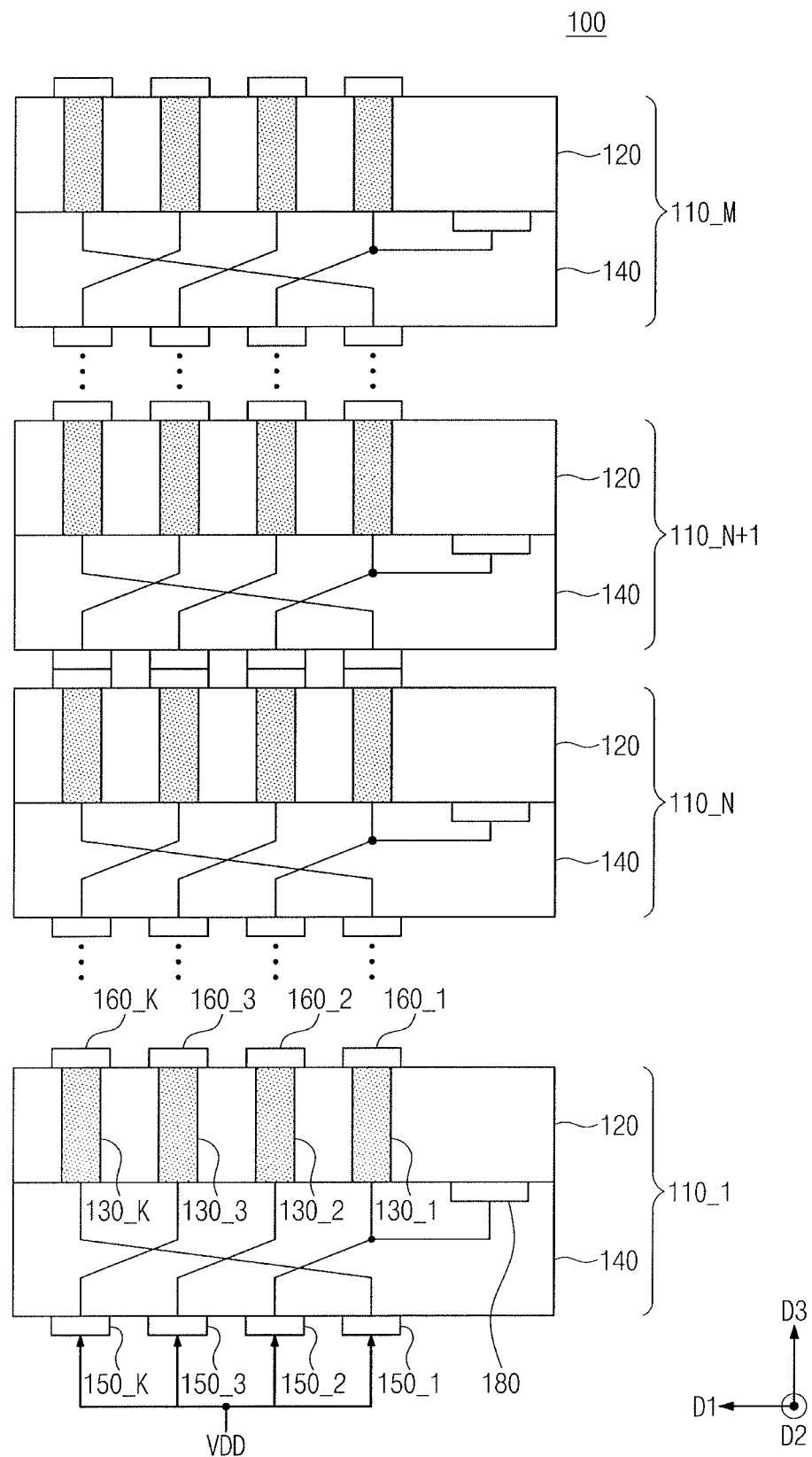
FIG. 1 illustrates a sectional view of a semiconductor device according to an embodiment.

FIG. 1 illustrates a sectional view of a semiconductor device according to an embodiment. A semiconductor device 100 may include first to M-th semiconductor dies 110_1 to 110_M sequentially stacked in a direction D3. The direction D3 may be a vertical direction. The vertical direction may indicate a direction in which the first to M-th semiconductor dies 110_1 to 110_M are stacked or a direction in which first through silicon vias 130_1 of the 110_1 to 110_M are disposed. Here, "M" may be an integer of 2 or more. Below, the first semiconductor die 110_1 will be described. A through silicon via may refer to a TSV or a through electrode.

The first semiconductor die 110_1 may include a substrate 120, first to K-th through silicon vias 130_1 to 130_K, an interconnection layer 140, first to K-th lower terminals 150_1 to 150_K, first to K-th upper terminals 160_1 to 160_K, and a circuit 180. Here, "K" may be an integer of 2 or more and "K" may be different from "M". For example, the number of through silicon vias may be greater than the number of semiconductor dies stacked in the semiconductor device 100.

The substrate 120 may include a silicon substrate of a wafer level or a chip level. Each of the first to K-th through silicon vias 130_1 to 130_K may pass (or penetrate) through the substrate 120 in the vertical direction, i.e., the direction D3. The first to K-th through silicon vias 130_1 to 130_K may be paths for transmitting electrical signals to the second semiconductor die 110_2 or receiving electrical signals from the second semiconductor die 110_2. For example, the first to K-th through silicon vias 130_1 to 130_K may be paths for supplying VDD (a supply voltage) to the second semiconductor die 110_2, i.e., they may be power through silicon vias. The first to K-th through silicon vias 130_1 to 130_K may be paths for supplying any other supply voltages, e.g., VSS, VPP, VDDQ, and the like, in addition to VDD to the second semiconductor die 110_2. FIG. 1 is a sectional view, and a plurality of through silicon vias may be arranged, for example, in a matrix arrangement.

Each of the first to K-th through silicon vias 130_1 to 130_K may have a pillar shape and may include a conductive material. An insulating layer may be between the substrate 120 and the first to K-th through silicon vias 130_1 to 130_K. The insulating layer may electrically insulate the substrate 120 and the first to K-th through silicon vias 130_1 to 130_K.

The interconnection layer 140 may include metal lines and vias connecting the metal lines. The metal lines and the vias provide electrical paths between the first to K-th through silicon vias 130_1 to 130_K, the first to K-th lower terminals 150_1 to 150_K, and the circuit 180. The interconnection layer 140 may include at least two layers (e.g., M1 and M2 layers shown in FIG. 2) in which metal lines are disposed. The metal lines in each of the at least two layers may be electrically connected to each other through at least one via. For example, an insulating layer (or an insulating film) may be between the at least two layers.

The first to K-th lower terminals 150_1 to 150_K of the first semiconductor die 110_1 may be supplied or provided with VDD from a power source. The first to K-th lower terminals 150_1 to 150_K may be supplied or provided with the above-described other supply voltages in addition to VDD. Also, the first to K-th lower terminals 150_1 to 150_K may be supplied or provided with a current based on a supply voltage. The first to K-th lower terminals 150_1 to 150_K may be pads including a conductive material. For clarity of description, the first to K-th lower terminals 150_1 to 150_K are illustrated as protruding from a first surface of the first semiconductor die 110_1. Alternatively, the first to K-th lower terminals 150_1 to 150_K may be flat, e.g., coplanar with the first surface of the first semiconductor die 110_1.

The first semiconductor die 110_1 may be stacked on a buffer die and VDD may be supplied from the buffer die. Here, the buffer die may refer to a logic die or an interface die. VDD may be an operating voltage of the second to M-th semiconductor dies 110_2 to 110_M as well as an operating voltage of the first semiconductor die 110_1. In another example, the first semiconductor die 110_1 may be the logic die.

The first to K-th lower terminals 150_1 to 150_K may be electrically connected to the first to K-th through silicon vias 130_1 to 130_K through the interconnection layer 140. According to an embodiment, each of the first to K-th lower terminals 150_1 to 150_K may not be electrically connected to a through silicon via of the first to K-th through silicon vias 130_1 to 130_K, which overlaps each of the first to K-th lower terminals 150_1 to 150_K in a top view or in a plan view (i.e., when viewing direction D1-direction D2 plane orthogonal to the direction D3) along the direction D3. In detail, the first lower terminal 150_1 may not be connected to the first through silicon via 130_1, the second lower terminal 150_2 may not be connected to the second through silicon via 130_2, the third lower terminal 150_3 may not be connected to the third through silicon via 130_3, and the K-th lower terminal 150_K may not be connected to the K-th through silicon via 130_K.

Each of the first to K-th lower terminals 150_1 to 150_K may be electrically connected to a through silicon via of the first to K-th through silicon vias 130_1 to 130_K, which does not overlap each of the first to K-th lower terminals 150_1 to 150_K in the plan view. For example, in the case where "K" is 4, the first lower terminal 150_1 may be connected to the fourth through silicon via 130_4, the second lower terminal 150_2 may be connected to the first through silicon via 130_1, the third lower terminal 150_3 may be connected to the second through silicon via 130_2, and the fourth lower terminal 150_4 may be connected to the third through silicon via 130_3. However, "K" is not limited to 4.

The first lower terminal 150_1 may be connected to the K-th through silicon via 130_K as illustrated in FIG. 1. Alternatively, the first lower terminal 150_1 may be connected to any one of the second to (K−1)-th through silicon vias 130_2 to 130_K−1. The second to K-th lower terminals 150_2 to 150_K may be connected as in the first lower terminal 150_1.

The first to K-th upper terminals 160_1 to 160_K may be electrically connected to the first to K-th through silicon vias 130_1 to 130_K, respectively. Unlike the first to K-th lower terminals 150_1 to 150_K, each of the first to K-th upper terminals 160_1 to 160_K may be electrically connected to a through silicon via of the first to K-th through silicon vias 130_1 to 130_K, which overlaps each of the first to K-th upper terminals 160_1 to 160_K in the plan view along the direction D3. Also, each of the first to K-th upper terminals 160_1 to 160_K may be electrically connected to a lower terminal of first to K-th lower terminals of the second semiconductor die 110_2, which overlaps each of the first to K-th upper terminals 160_1 to 160_K in the plan view. For clarity of description, the first to K-th upper terminals 160_1 to 160_K are illustrated as protruding from a second surface, opposite the first surface, of the first semiconductor die 110_1. However, the first to K-th upper terminals 160_1 to 160_K may be flat (or even), e.g., coplanar with the second surface of the first semiconductor die 110_1.

The circuit 180 may be provided on the substrate 120. For example, the circuit 180 may include memory cells, a circuit for accessing the memory cell, a logic circuit, combinations thereof, and the like. When the circuit 180 includes memory cells, a semiconductor die may be referred to a "memory die" or a "buffer die", and a semiconductor device may be referred to as a "memory device". For example, the memory cells may include at least one of a dynamic random access memory (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, and a magnetic random access memory (MRAM) cell. For example, the memory device may be a dynamic random access memory (DRAM) such as a high bandwidth memory (HBM), HBM2, or HBM3.

The circuit 180 may be supplied or provided with a voltage VDD and a current based on the voltage VDD, through a power supply line electrically connected to the second lower terminal 150_2 and the first through silicon via 130_1. Here, the power supply line electrically connected to the second lower terminal 150_2 and the first through silicon via 130_1 are not electrically connected to the remaining lower terminals 150_1, 150_3 to 150_K and the remaining through silicon vias 130_2 to 130_K. The circuit 180 may be adjacent to the first to K-th through silicon vias 130_1 to 130_K and may be supplied with VDD through a power supply line connected to the closest through silicon via (i.e., the first through silicon via 130_1) of the first to K-th through silicon vias 130_1 to 130_K. Below, the first to M-th semiconductor dies 110_1 to 110_M will be described.

The first to M-th semiconductor dies 110_1 to 110_M may be substantially identically manufactured. The second to M-th semiconductor dies 110_2 to 110_M may be sequentially stacked on the first semiconductor die 110_1 in the direction D3.

Each of first to K-th upper terminals of the N-th semiconductor die 110_N may be electrically connected to a lower terminal of first to K-th lower terminals of the (N+1)-th semiconductor die 110_N+1, which overlaps each of the first to K-th upper terminals of the N-th semiconductor die 110_N in the plan view. Here, "N" may be an integer that is not less than 1 and is not more than "M−1". For example, microbumps may be between the first to K-th upper terminals of the N-th semiconductor die 110_N and the first to K-th lower terminals of the (N+1)-th semiconductor die 110_N+1. The first to K-th through silicon vias 130_1 to 130_K, the first to K-th lower terminals 150_1 to 150_K, and the first to K-th upper terminals 160_1 to 160_K of the first to M-th semiconductor dies 110_1 to 110_M may be connected to a power source generating VDD. VDD may be supplied to the circuits 180 of the first to M-th semiconductor dies 110_1 to 110_M.

The (N+1)-th semiconductor die 110_N+1 may be stacked on the N-th semiconductor die 110_N. Each of first to K-th through silicon vias of the N-th semiconductor die 110_N may be electrically connected to a through silicon via of first to K-th through silicon vias of the (N+1)-th semiconductor die 110_N+1, which does not overlap each of the first to K-th through silicon vias of the N-th semiconductor die 110_N in the plan view. In other words, each of first to K-th through silicon vias of the N-th semiconductor die 110_N may be electrically connected to a through silicon via of first to K-th through silicon vias of the (N+1)-th semiconductor die 110_N+1 that is spaced apart therefrom in the plan view. That is, the first through silicon vias 130_1 of the first to M-th semiconductor dies 110_1 to 110_M may not be electrically connected to each other. The K-th through silicon vias 130_K of the first to M-th semiconductor dies 110_1 to 110_M may not be electrically connected to each other. As described above, "K" is an integer of 2 or more.

The first through silicon via of the N-th semiconductor die 110_N may be electrically connected to the K-th through silicon via of the (N+1)-th semiconductor die 110_N+1. The second to K-th through silicon vias of the N-th semiconductor die 110_N may be electrically connected to the first to (K−1)-th through silicon via of the (N+1)-th semiconductor die 110_N+1, respectively. Alternatively, the first through silicon via of the N-th semiconductor die 110_N may be electrically connected to any one of the second to the (K−1)-th through silicon via of the (N+1)-th semiconductor die 110_N+1.

In FIG. 1, it is assumed that each of "M" and "K" is 4 and "N" is 2. The first through silicon via 130_1 of the first semiconductor die 110_1, a fourth through silicon via of the second semiconductor die 110_2, a third through silicon via of the third semiconductor die 110_3, and a second through silicon via of the fourth semiconductor die 110_4 may be electrically connected to each other. The remaining through silicon vias of the first to fourth semiconductor dies 110_1 to 110_4 may be connected as in the above-described manner. Alternatively, the first through silicon via 130_1 of the first semiconductor die 110_1 may be electrically connected to one of the second and third through silicon vias of the second semiconductor die 110_2.

A circuit of the fourth semiconductor die 110_4 may receive VDD through the fourth through silicon via 130_4 of the first semiconductor die 110_1, a third through silicon via of the second semiconductor die 110_2, and a second through silicon via of the third semiconductor die 110_3. A circuit of the third semiconductor die 110_3 may receive VDD through the third through silicon via 130_3 of the first semiconductor die 110_1 and a second through silicon via of the second semiconductor die 110_2. A circuit of the second semiconductor die 110_2 may receive VDD through the second through silicon via 130_2 of the first semiconductor die 110_1.

According to an embodiment, even though a plurality of semiconductor dies are stacked, a current for supplying VDD to the semiconductor dies may be uniformly distributed through first to K-th through silicon vias. That is, a current for supplying VDD to the semiconductor dies may not be focused or increased on certain through silicon vias (e.g., the through silicon vias adjacent to the circuits or through silicon vias placed in a relatively lower layer, a relatively under layer, or a relatively bottom layer) of the first to K-th through silicon vias. Since a current uniformly flows through the first to K-th through silicon vias, the lifespan of the through silicon vias may increase. The phenomenon of electromigration of the through silicon vias may be reduced or prevented.

Figure 2:
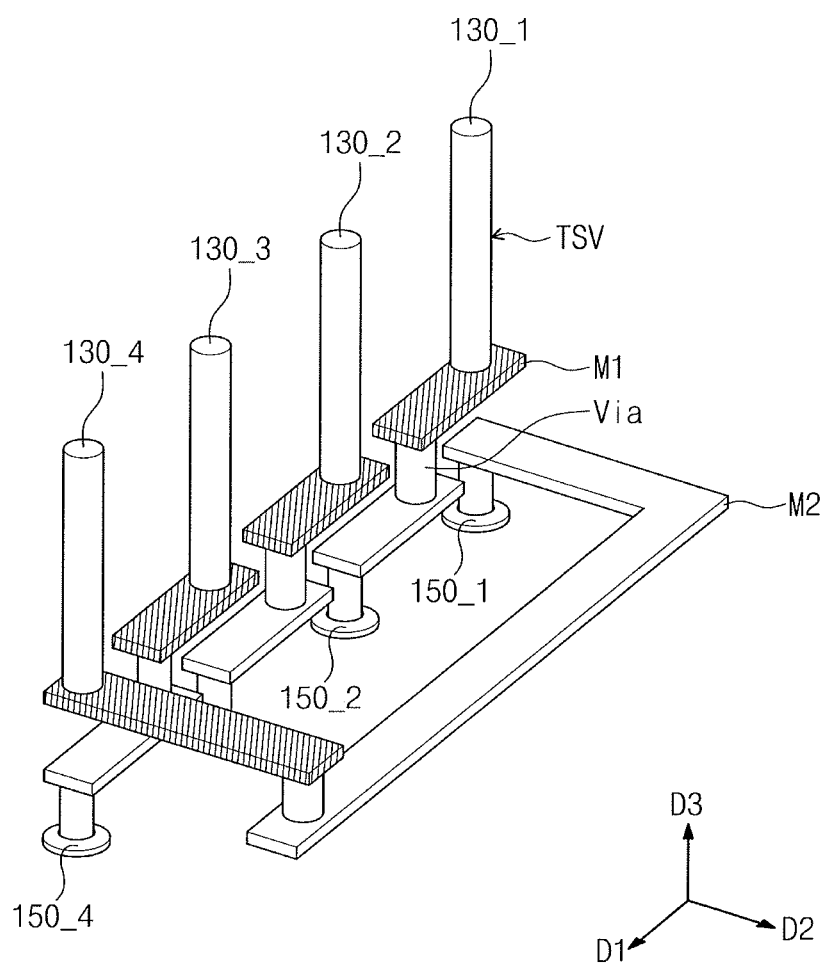
FIG. 2 illustrates a perspective view of an interconnection layer of a first semiconductor die of FIG. 1.

FIG. 2 illustrates a perspective view of the interconnection layer 140 of the first semiconductor die 110_01 of FIG. 1. FIG. 2 will be described with reference to FIG. 1. In FIG. 2, it is assumed that "N" is 4. For brevity of illustration, an example is illustrated as the M1 layer and TSV are directly connected to each other, but any other conductive material may be present between the M1 layer and the TSV.

The first through silicon via 130_1 may be electrically connected to the second lower terminal 150_2 through metal lines and vias in the M1 layer and the M2 layer. As for the first through silicon via 130_1, the second and third through silicon vias 130_2 and 130_3 may be respectively electrically connected to the third and fourth lower terminals 150_3 and 150_4 through metal lines and vias. In other words, the first to third through silicon vias 130-1 to 130_3 may be connected to second to fourth lower terminal 150_2 and 150_4 adjacent thereto and shifted along the first direction D1. Thus, paths (vias and metal lines) electrically connecting the first to third through silicon vias 130_1 to 130_3 and the second to fourth lower terminals 150_2 to 150_4 may be substantially identically manufactured or formed. For example, the metal lines in both the M1 and M2 layers may extend along the first direction D1, may partially overlap along the third direction, and may be connected by vias extending along the third direction D3.

The fourth through silicon via 130_4 may be electrically connected to the first lower terminal 150_1 through metal lines and vias in the M1 layer and the M2 layer. For example, a path electrically connecting the fourth through silicon via 130_4 and the first lower terminal 150_1 may be different from paths electrically connecting the first to third through silicon vias 130_1 to 130_3 and the second to fourth lower terminals 150_2 to 150_4. An example is illustrated in FIG. 2, in which a metal line in the M1 layer extends along the second direction D2, overlaps a metal line in the M2 layer that extends along the first direction D1 at a first end thereof, and is connected thereto by a via extending along the third direction D3. The metal line in the M2 layer includes a portion that extends from a second end of the metal line extending in the first direction D1 along the second direction D2 to overlap the first lower terminal 150_1 to be connected thereto with a via along the third direction D3. Thus, the metal line in the M2 layer for the fourth through silicon via 130_4 may extend along the first direction longer that those for each of the first to third through silicon vias 130_1 to 130_3 to electrically connect the fourth through silicon via 130_4 and the first lower terminal 150_1. Alternatively, a metal line of the M1 layer may be longer for the fourth through silicon via 130_4 may extend along the first direction longer that those for each of the first to third through silicon vias 130_1 to 130_3 to electrically connect the fourth through silicon via 130_4 and the first lower terminal 150_1.

Figure 3:
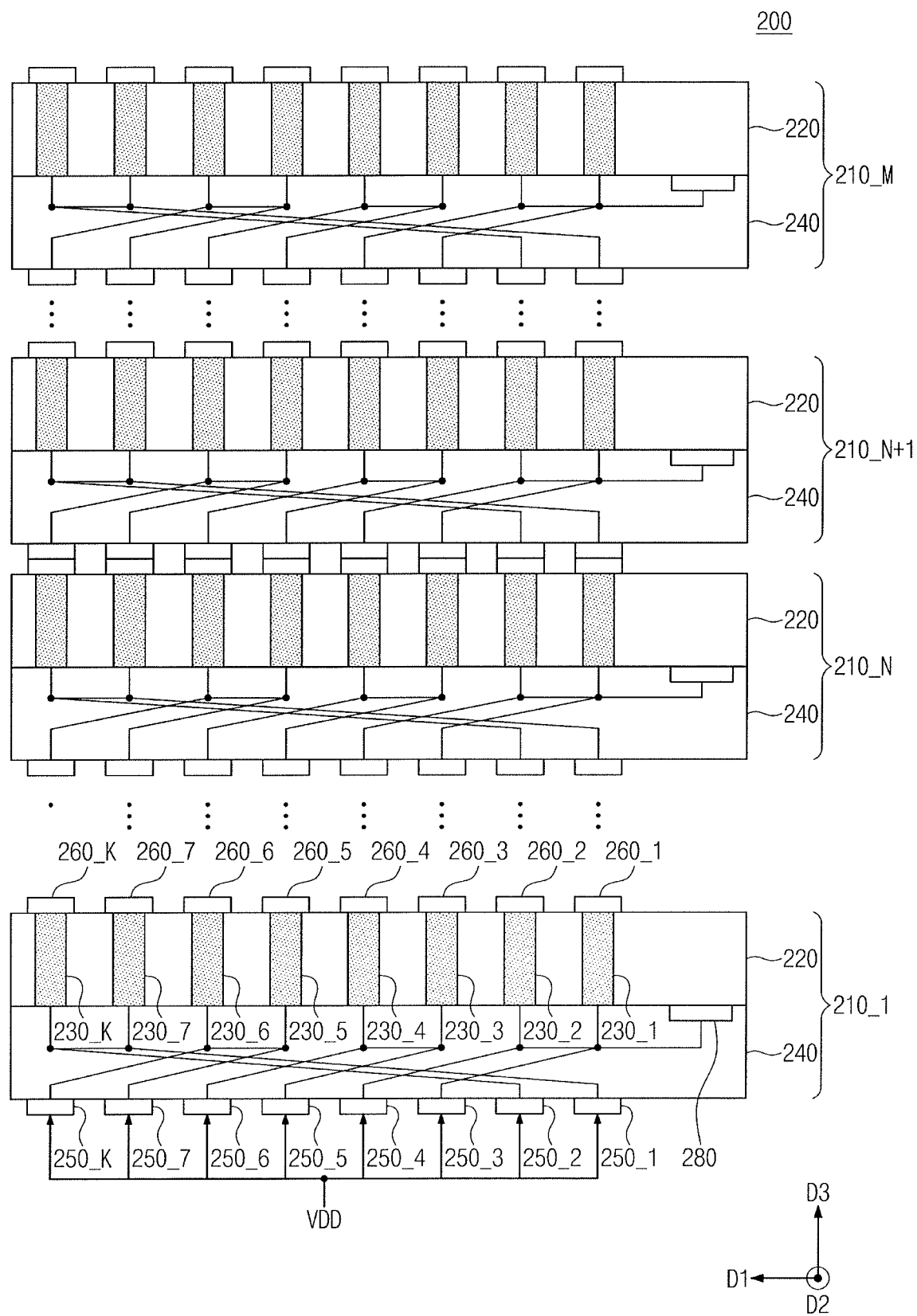
FIG. 3 illustrates a sectional view of another example of a semiconductor device of FIG. 1.

FIG. 3 is a sectional view illustrating another example of a semiconductor device of FIG. 1. FIG. 3 will be described with reference to FIG. 1. Below, a description will be given with respect to a difference between the semiconductor device 100 and a semiconductor device 200 of FIG. 3.

The semiconductor device 200 may include first to M-th semiconductor dies 210_1 to 210_M sequentially stacked in the direction D3. The first to M-th semiconductor dies 210_1 to 210_M may be substantially identically manufactured. The first semiconductor die 210_1 may include a substrate 220, first to K-th through silicon vias 230_1 to 230_K, an interconnection layer 240, first to K-th lower terminals 250_1 to 250_K, first to K-th upper terminals 260_1 to 260_K, and a circuit 280.

Unlike the semiconductor device 100, in the semiconductor device 200, at least two through silicon vias may be connected like one through silicon via (or as one group) as in the way to connect through silicon vias of the semiconductor device 100. The first to K-th through silicon vias 230_1 to 230_K may be divided or classified into first to G-th groups. Here, "G" may be an integer that is not less than 2 and is not more than "K−1". For example, through silicon vias included in each of the first to G-th groups may be electrically connected to each other, and the number of through silicon vias included in one group may be at least two or more. The circuit 280 may be electrically connected to through silicon vias included in a group including the first through silicon via 230_1. Through silicon vias included in any one group may not be electrically connected to through silicon vias included in another group.

The first to G-th groups may include the same number of through silicon vias. In FIG. 3, it is assumed that "K" is 8 and "G" is 4. Each of the first to G-th groups may include two through silicon vias. In another embodiment, the first to G-th groups may include different numbers of through silicon vias. For example, the number of through silicon vias included in the first group may be different from the number of through silicon vias included in the second group.

Referring to FIG. 3, the first and second through silicon vias 230_1 and 230_2 may be supplied with VDD from the third and fourth lower terminals 250_3 and 250_4 like one through silicon via. As in the first and second through silicon vias 230_1 and 230_2, the remaining through silicon vias 230_3 to 230_K may be supplied with VDD from the first, second, and fifth to K-th lower teiminals 250_1, 250_2, and 250_5 to 250_K. The circuit 280 may be supplied with VDD through a power supply line that is electrically connected to the third and fourth lower terminals 250_3 and 250_4 and the first and second through silicon vias 230_1 and 230_2.

The first and second through silicon vias of the N-th semiconductor die 210_N may be electrically connected to the (K−1)-th and K-th through silicon via of the (N+1)-th semiconductor die 210_N+1. As in the above description, the third to K-th through silicon vias of the N-th semiconductor die 210_N may be electrically connected to the first to (K−2)-th through silicon via of the (N+1)-th semiconductor die 210_N+1. As described above, "N" may be an integer that is not less than 1 and is not more than "M−1".

In detail, it is assumed in FIG. 3 that "M" is 4, "K" is 8, and "N" is 2. The first and second through silicon vias 230_1 and 230_2 of the first semiconductor die 210_1, seventh and eighth through silicon vias of the second semiconductor die 210_2, fifth and sixth through silicon vias of the third semiconductor die 210_3, and third and fourth through silicon vias of the fourth semiconductor die 210_4 may be electrically connected to each other. The remaining through silicon vias of the first to fourth semiconductor dies 210_1 to 210_4 may be connected as in the above-described manner.

Thus, the first to (K−2)-th through silicon vias may have a same path (vias and metal lines) in the interconnection layer 240, e.g., may be connected to lower terminals shifted along the first direction D1 by a number of through silicon vias included in a group, while (K−1)-th through silicon via and the K-th through silicon via may have a different path from the others.

Figure 4:
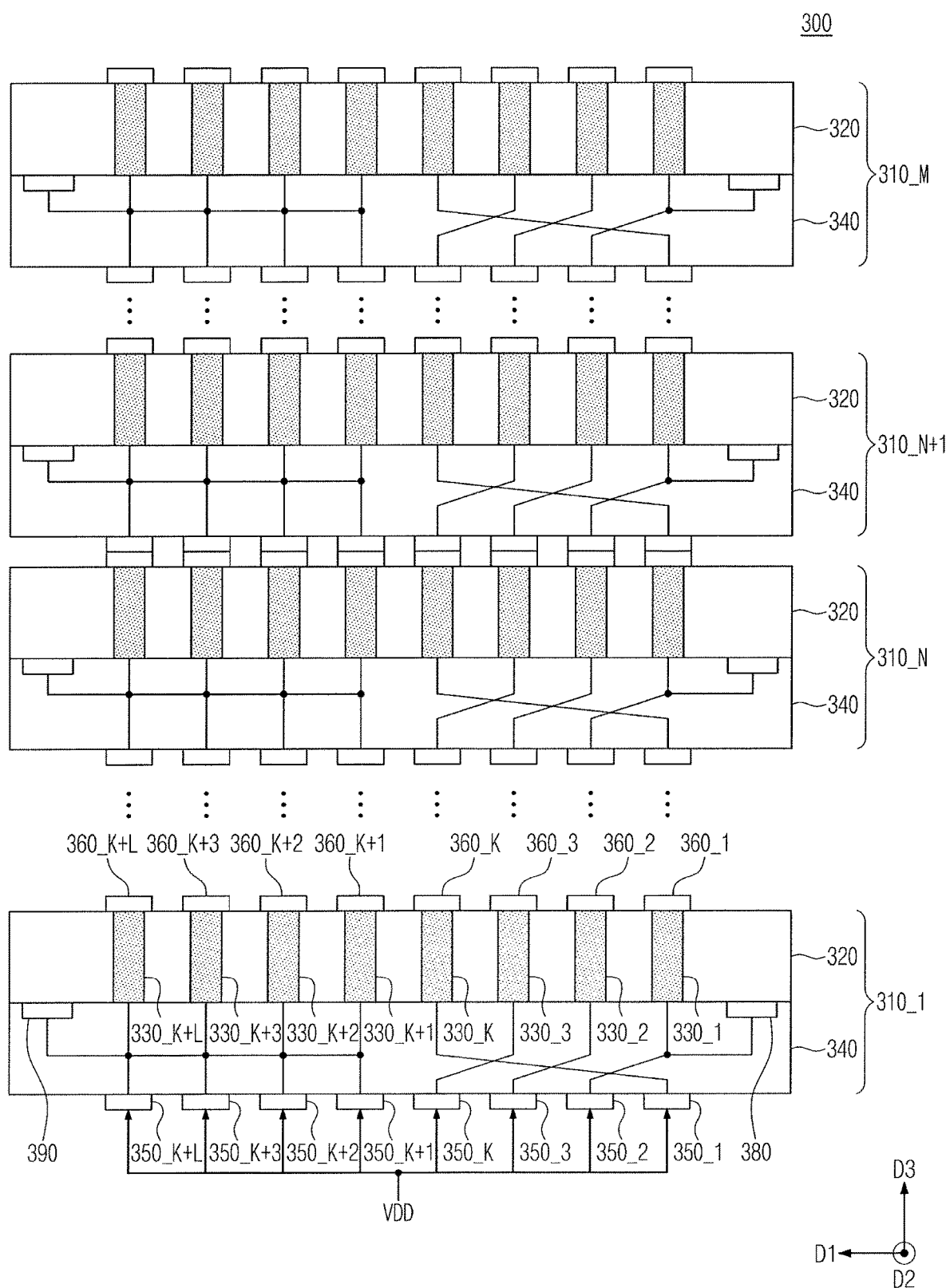
FIG. 4 illustrates a sectional view of another example of a semiconductor device of FIG. 1.

FIG. 4 is a sectional view illustrating another example of a semiconductor device of FIG. 1. FIG. 4 will be described with reference to FIGS. 1 and 3. Below, a description will be given with respect to a difference between the semiconductor devices 100 and 200, and a semiconductor device 300 of FIG. 4.

The semiconductor device 300 may include first to M-th semiconductor dies 310_1 to 310_M sequentially stacked in the direction D3. The first to M-th semiconductor dies 310_1 to 310_M may be substantially identically manufactured. The first semiconductor die 310_1 may include a substrate 320, first to K-th through silicon vias 330_1 to 330_K, (K+1)-th to (K+L)-th through silicon vias 330_K+1 to 330_K+L, an interconnection layer 340, first to K-th lower terminals 350_1 to 350_K, (K+1)-th to (K+L)-th lower terminals 350_K+1 to 350_K+L, first to K-th upper terminals 360_1 to 360_K, (K+1)-th to (K+L)-th upper terminals 360_K+1 to 360_K+L, a first circuit 380, and a second circuit 390. Here, each of "M", "K", and "L" may be an integer of 2 or more. The first semiconductor die 310_1 may include circuits having different levels of power consumption. For example, the first circuit 380 may have relatively high power consumption and the second circuit 390 may have relatively low power consumption.

The substrate 320, the first to K-th through silicon vias 330_1 to 330_K, the interconnection layer 340, the first to K-th lower terminals 350_1 to 350_K, the first to K-th upper terminals 360_1 to 360_K, and the first circuit 380 of the first semiconductor die 310_1 may be manufactured substantially the same as the components 120, 130_1 to 130_K, 140, 150_1 to 150_K, 160_1 to 160_K, and 180 of the first semiconductor die 110_1 described with reference to FIG. 1. Thus, a current for supplying VDD to the first circuits 380 of the first to M-th semiconductor dies 310_1 to 310_M may be uniformly distributed through the first to K-th through silicon vias.

The (K+1)-th to (K+L)-th through silicon vias 330_K+1 to 330_K+L, the (K+1)-th to (K+L)-th lower terminals 350_K+1 to 350_K+L, and the (K+1)-th to (K+L) upper terminals 360_K+1 to 360_K+L may be electrically connected to each other. The (K+1)-th to (K+L)-th through silicon vias 330_K+1 to 330_K+L may be connected to the power source together with the first to K-th through silicon vias 330_1 to 330_K.

For example, a metal line in one layer of the interconnection layer 340 may be used to connect the (K+1)-th to the (K+L)-th through silicon vias 330_K+1 to 330_K+L and the (K+1)-th to (K+L)-th lower terminals 350_K+1 to 350_K+L. In contrast, metal lines in at least two layers of the interconnection layer 340 may be used to connect the first to K-th through silicon vias 330_1 to 330_K and the first to K-th lower terminals 350_1 to 350_K, respectively. That is, an electrical connection (i.e., a power supply line) between the (K+1)-th to (K+L)-th through silicon vias 330_K+1 to 330_K+L and the (K+1)-th to the (K+L)-th lower terminals 350_K+1 to 350_K+L may be more simply formed than an electrical connection between the first to K-th through silicon vias 330_1 to 330_K and the first to K-th lower terminals 350_1 to 350_K. In particular, the (K+1)-th to the (K+L)-th through silicon vias 330_K+1 may be connected to corresponding lower terminals 350_K+1 to 350_K+L, e.g., that overlap along the third direction D3 in a plan view. The second circuit 390 may be supplied or provided with VDD through a power supply line electrically connected to the (K+1)-th to the (K+L)-th through silicon vias 330_K+1 to 330_K+L.

The (N+1)-th semiconductor die 310_N+1 may be stacked on the N-th semiconductor die 310_N. First to K-th upper terminals and (K+1)-th to (K+L)-th upper terminals of the N-th semiconductor die 310_N may be electrically connected to first to K-th lower terminals and (K+1)-th to (K+L)-th lower terminals of the (N+1)-th semiconductor die 310_N+1. As described above, "N" may be an integer that is not less than 1 and is not more than "M−1". The (K+1)-th to (K+L)-th through silicon vias of the N-th semiconductor die 310_N may be electrically connected to the (K+1)-th to (K+L)-th through silicon vias of the (N+1)-th semiconductor die 310_N+1. The (K+1)-th to (K+L)-th through silicon vias of the N-th semiconductor die 310_N may respectively overlap the (K+1)-th to (K+L)-th through silicon vias of the (N+1)-th semiconductor die 310_N+1 in the plan view.

A current for supplying VDD to the second circuits 390 may not be uniformly distributed through the (K+1)-th to (K+L)-th through silicon vias. Instead, since being manufactured or formed through a metal line disposed in one layer, a power path for supplying VDD to the second circuit 390 may be more simple than a power path for supplying VDD to the first circuit 380. However, since the power consumption of the second circuit 390 is less than that of the first circuit 380, non-uniformity of the current is less of an issue. Thus, trade-offs between complexity of the paths in the interconnection layer 340 and uniformity requirement may be made for different circuits within the semiconductor device.

Figure 5:
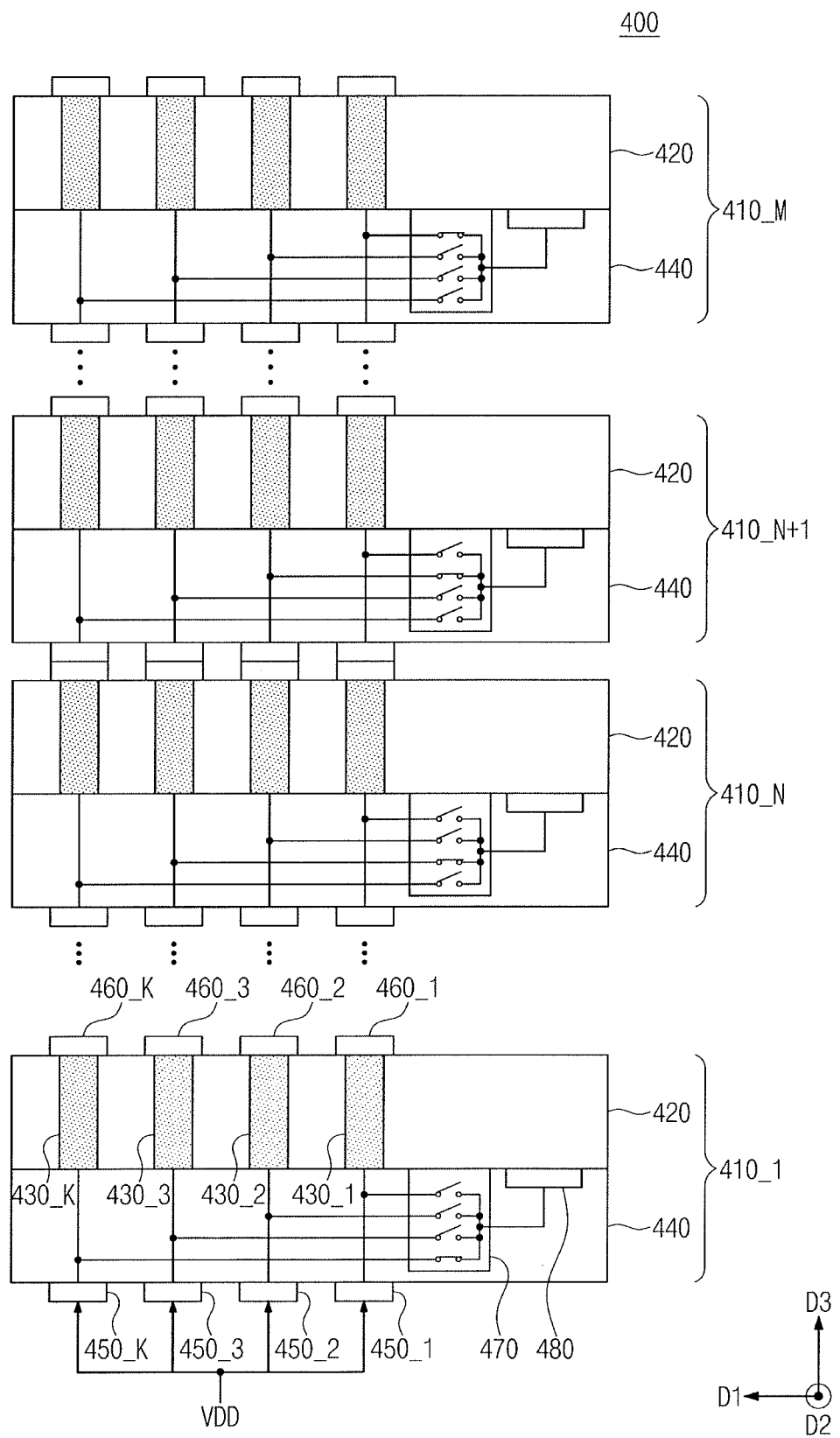
FIG. 5 illustrates a sectional view of a semiconductor device according to an embodiment.

FIG. 5 is a sectional view illustrating a semiconductor device according to an embodiment. Below, a description will be given with respect to a difference between the semiconductor device 100 and a semiconductor device 400 of FIG. 5. The semiconductor device 400 may include first to M-th semiconductor dies 410_1 to 410_M sequentially stacked in the direction D3. The first to M-th semiconductor dies 410_1 to 410_M may be substantially identically manufactured.

The first semiconductor die 410_1 may include a substrate 420, first to K-th through silicon vias 430_1 to 430_K, an interconnection layer 440, first to K-th lower terminals 450_1 to 450_K, first to K-th upper terminals 460_1 to 460_K, a switch circuit 470, and a circuit 480. Here, the substrate 420, the first to K-th through silicon vias 430_1 to 430_K, the first to K-th lower terminals 450_1 to 450_K, the first to K-th upper terminals 460_1 to 460_K, and the circuit 480 may be manufactured substantially the same as the components 120, 130_1 to 130_K, 150_1 to 150_K, 160_1 to 160_K, and 180 of the first semiconductor die 110_1 described with reference to FIG. 1.

Each of the first to K-th lower terminals 450_1 to 450_K may be electrically connected to a through silicon via of the first to K-th through silicon vias 430_1 to 430_K, which overlaps each of the first to K-th lower terminals 450_1 to 450_K in the plan view, through the interconnection layer 440. The first to K-th lower terminals 450_1 to 450_K may not be connected to each other. Accordingly, metal lines of the interconnection layer 440 respectively connecting the first to K-th lower terminals 450_1 to 450_K and the first to K-th through silicon vias 430_1 to 430_K may be manufactured differently from metal lines (refer to metal lines of FIG. 2) of the interconnection layer 140 of FIG. 1. Each of first to K-th through silicon vias of the N-th semiconductor die 410_N may be electrically connected to a through silicon via of first to K-th through silicon vias of the (N+1)-th semiconductor die 410_N+1, which overlaps each of the first to K-th through silicon vias of the N-th semiconductor die 410_N in the plan view.

The switch circuit 470 may select power supply lines electrically connected to the first to K-th through silicon vias 430_1 to 430_K. The switch circuit 470 may include first to S-th switches. Here, "S" may be an integer of 2 or more and may be identical to or different from "K". In FIG. 5, each of "K" and "S" may be 4, and one power supply line may be electrically connected to one of the first to K-th through silicon vias 430_1 to 430_K and one of the first to S-th switches.

The circuit 480 may be supplied or provided with VDD and a current through one of the first to S-th switches in the switch circuit 470. The circuit 480 may be electrically connected to at least one power supply line selected by one of the first to S-th switches.

A through silicon via that is connected to a power supply line selected by the switch circuit 470 of the N-th semiconductor die 410_N may not be electrically connected to a through silicon via that is connected to a power supply line selected by the switch circuit 470 of the (N+1)-th semiconductor die 410_N+1. The (N+1)-th semiconductor die 410_N+1 may be stacked on the N-th semiconductor die 410_N. A length from the first semiconductor die 410_1 to the (N+1)-th semiconductor die 410_N+1 in the direction D3 may be longer than a length from the first semiconductor die 410_1 to the N-th semiconductor die 410_N in the direction D3. Accordingly, a length of a power supply line selected by a switch circuit 470 of the N-th semiconductor die 410_N may be longer, e.g., along the first direction D1, than a length a power supply line selected by a switch circuit of the (N+1)-th semiconductor die 410_N+1. That is, as "N" increases, e.g., as a distance along the third direction D3 of the first semiconductor die 410_1 increases, a length of a power supply line selected by a switch circuit may decrease. As described above, "N" may be an integer that is not less than 1 and is not more than "M−1".

For example, assume in FIG. 5 that each of "M" and "K" is 4 and "N" is 2. The first through silicon vias 430_1 of the first to M-th semiconductor dies 410_1 to 410_4 may be electrically connected to each other. The remaining through silicon vias of the first to fourth semiconductor dies 410_1 to 410_4 may be connected as in the above-described manner.

A circuit of the fourth semiconductor die 410_4 may receive VDD through the first through silicon via 430_1 of the first to third semiconductor dies 410_1 to 410_3. A circuit of the third semiconductor die 410_3 may receive VDD through the second through silicon vias 430_2 of the first and second semiconductor dies 410_1 and 410_2. A circuit of the second semiconductor die 410_2 may receive VDD through the third through silicon via 430_2 of the first semiconductor die 410_1. As in the description given with reference to the semiconductor device 100 of FIG. 1, a current for supplying VDD to a plurality of semiconductor dies may be uniformly distributed through first to K-th through silicon vias.

In another embodiment, the switch circuit 470 of the first semiconductor die 410_1 may select power supply lines electrically connected to the first to K-th through silicon vias 430_1 to 430_K, based on a stack identifier (ID) of the first semiconductor die 410_1 or an operating mode of the circuit 480 of the first semiconductor die 410_1. Here, the stack identifier refers to information for identifying the first to M-th semiconductor dies 410_1 to 410_M. Each of the first to M-th semiconductor dies 410_1 to 410_M may store a unique stack identifier therein.

A switch circuit of each of the first to M-th semiconductor dies 410_1 to 410_M is illustrated in FIG. 5 as selecting one power supply line. Alternatively, the circuit 480 may include memory cells, only a circuit of the N-th semiconductor die 410_N may perform a read operation, a write operation, a refresh operation, etc. associated with memory cells, and power consumption of the circuit of the N-th semiconductor die 410_N may increase. In this case, the switch circuit of the N-th semiconductor die 410_N may select all power supply lines, and the remaining switch circuits of the remaining semiconductor dies may not select power supply lines. That is, all the first to K-th through silicon vias may be used to supply VDD to one circuit of the N-th semiconductor die 410_N.

Figure 6:
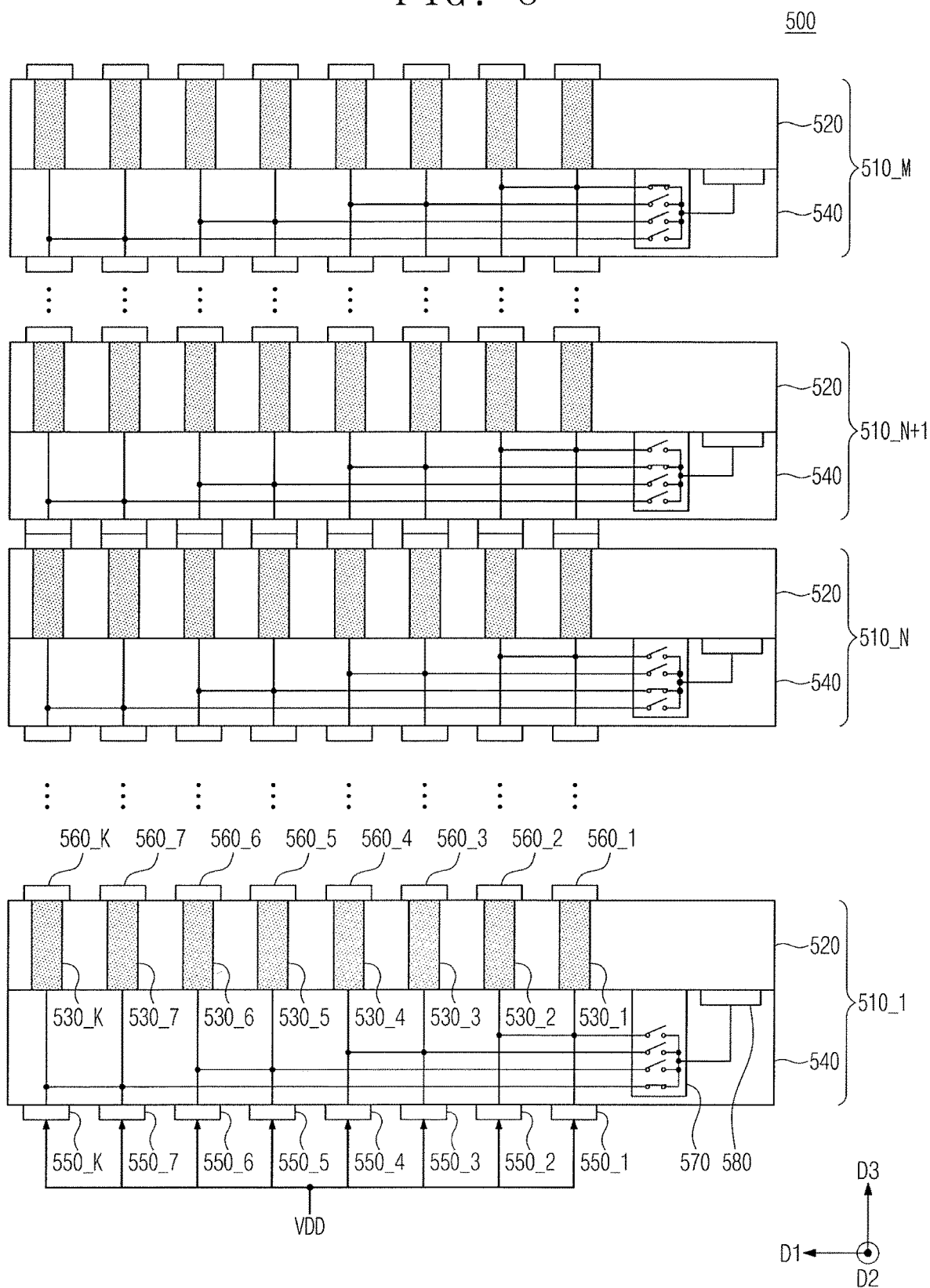
FIG. 6 illustrates a sectional view of another example of a semiconductor device of FIG. 5.

FIG. 6 is a sectional view illustrating another example of a semiconductor device of FIG. 5. FIG. 6 will be described with reference to FIG. 5. Below, a description will be given with respect to a difference between the semiconductor device 400 and a semiconductor device 500 of FIG. 6.

The semiconductor device 500 may include first to M-th semiconductor dies 510_1 to 510_M sequentially stacked in the direction D3. The first to M-th semiconductor dies 510_1 to 510_M may be substantially identically manufactured. The first semiconductor die 510_1 may include a substrate 520, first to K-th through silicon vias 530_1 to 530_K, an interconnection layer 540, first to K-th lower terminals 550_1 to 550_K, first to K-th upper terminals 560_1 to 560_K, a switch circuit 570, and a circuit 580.

Unlike the semiconductor device 400, in the semiconductor device 500, at least two through silicon vias may be connected like one through silicon via (or as one group) as the through silicon vias of the semiconductor device 400 are connected. As in the first to K-th through silicon vias 230_1 to 230_K described with reference to FIG. 3, the first to K-th through silicon vias 530_1 to 530_K may be divided into first to G-th groups. As described above, "G" may be an integer that is not less than 2 and is not more than "K−1". For example, through silicon vias included in each of the first to G-th groups may be electrically connected to each other, and the number of through silicon vias included in one group may be at least two or more. The circuit 580 may be electrically connected to through silicon vias included in a group including the first through silicon via 530_1. Through silicon vias included in any one group may not be electrically connected to through silicon vias included in another group.

The number of through silicon vias included in each of the first to G-th groups may be uniform. In FIG. 6, it is assumed that "K" is 8 and "G" is 4. Each of the first to G-th groups may include two through silicon vias. In another embodiment, the first to G-th groups may include different numbers of through silicon vias. For example, the number of through silicon vias included in the first group may be different from the number of through silicon vias included in the second group.

When the first to K-th through silicon vias 530_1 to 530_K are divided into the first to G-th groups, the switch circuit 570 may select a power supply line connected to through silicon vias included in one of the first to G-th groups. As in the switch circuit 470, the switch circuit 570 may include first to S-th switches. Here, "S" may be an integer of 2 or more and may be identical to or different from "K". In FIG. 6, "K" and "S" may be 8 and 4, and one power supply line may be electrically connected to through silicon vias included in one of the first to G-th groups and one of the first to S-th switches of the switch circuit 570.

Referring to FIG. 6, the first and second through silicon vias 530_1 and 530_2 may be supplied with VDD from the first and second lower terminals 550_1 and 550_2 like one through silicon via. As in the first and second through silicon vias 530_1 and 530_2, the third to K-th through silicon vias 530_3 to 530_K may be supplied with VDD from the third to K-th lower terminals 550_3 to 550_K.

The first and second through silicon vias of the N-th semiconductor die 510_N may be electrically connected to the first and second through silicon via of the (N+1)-th semiconductor die 510_N+1. As in the first and second through silicon vias, the third to K-th through silicon vias of the N-th semiconductor die 510_N may be electrically connected to the third to K-th through silicon via of the (N+1)-th semiconductor die 510_N+1. As described above, "N" may be an integer that is not less than 1 and is not more than "M−1". At least two through silicon vias that are connected to a power supply line selected by a switch circuit of the N-th semiconductor die 510_N may not be electrically connected to at least two through silicon vias that are connected to a power supply line selected by the switch circuit 570 of the (N+1)-th semiconductor die 510_N+1.

Figure 7:
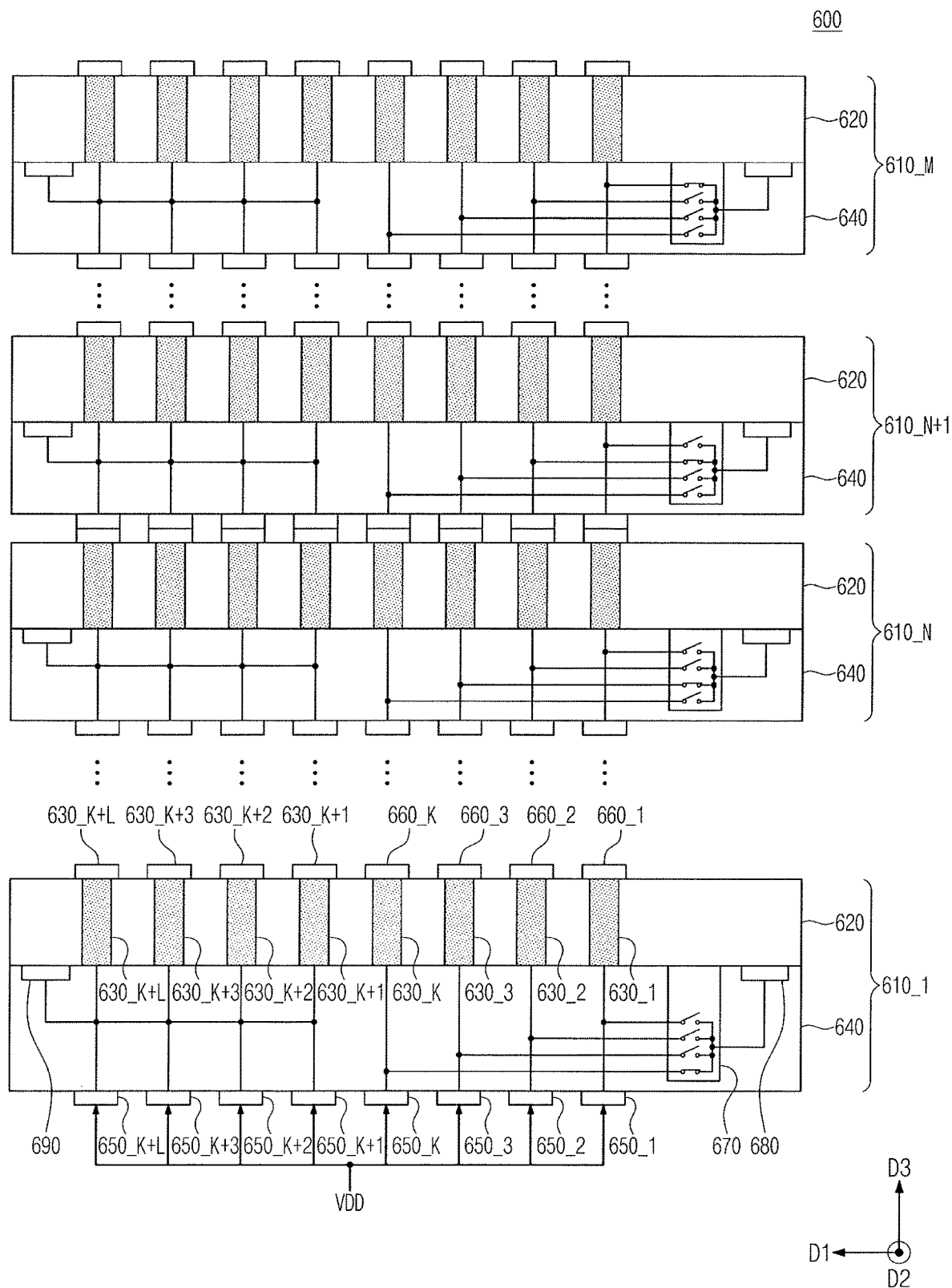
FIG. 7 illustrates a sectional view of another example of a semiconductor device of FIG. 5.

FIG. 7 is a sectional view illustrating another example of a semiconductor device of FIG. 5. FIG. 7 will be described with reference to FIGS. 4 and 5.

A semiconductor device 600 may include first to M-th semiconductor dies 610_1 to 610_M sequentially stacked in the direction D3. The first to M-th semiconductor dies 610_1 to 610_M may be substantially identically manufactured. The first semiconductor die 610_1 may include a substrate 620, first to K-th through silicon vias 630_1 to 630_K, (K+1)-th to (K+L)-th through silicon vias 630_K+1 to 630_K+L, an interconnection layer 640, first to K-th lower terminals 650_1 to 650_K, (K+1)-th to (K+L)-th lower terminals 650_K+1 to 650_K+L, first to K-th upper terminals 660_1 to 660_K, (K+1)-th to (K+L)-th upper terminals 660_K+1 to 660_K+L, a first circuit 680, and a second circuit 690.

The substrate 620, the first to K-th through silicon vias 630_1 to 630_K, the interconnection layer 640, the first to K-th lower terminals 650_1 to 650_K, the first to K-th upper terminals 660_1 to 660_K, and the first circuit 680 of the first semiconductor die 610_1 may be manufactured substantially the same as the components 420, 430_1 to 430_K, 440, 450_1 to 450_K, 460_1 to 460_K, and 480 of the first semiconductor die 410_1 described with reference to FIG. 5.

The (K+1)-th to (K+L)-th through silicon vias 630_K+1 to 630_K+L, the (K+1)-th to (K+L)-th lower terminals 650_K+1 to 650_K+L, the (K+1)-th to (K+L)-th upper terminals 660_K+1 to 660_K+L, and the second circuit 690 of the first semiconductor die 610_1 may be manufactured substantially the same as the components 330_K+1 to 330_K+L, 350_K+1 to 350_K+L, 360_K+1 to 360_K+L, and 390 of the first semiconductor die 310_1 described with reference to FIG. 4.

Figure 8:
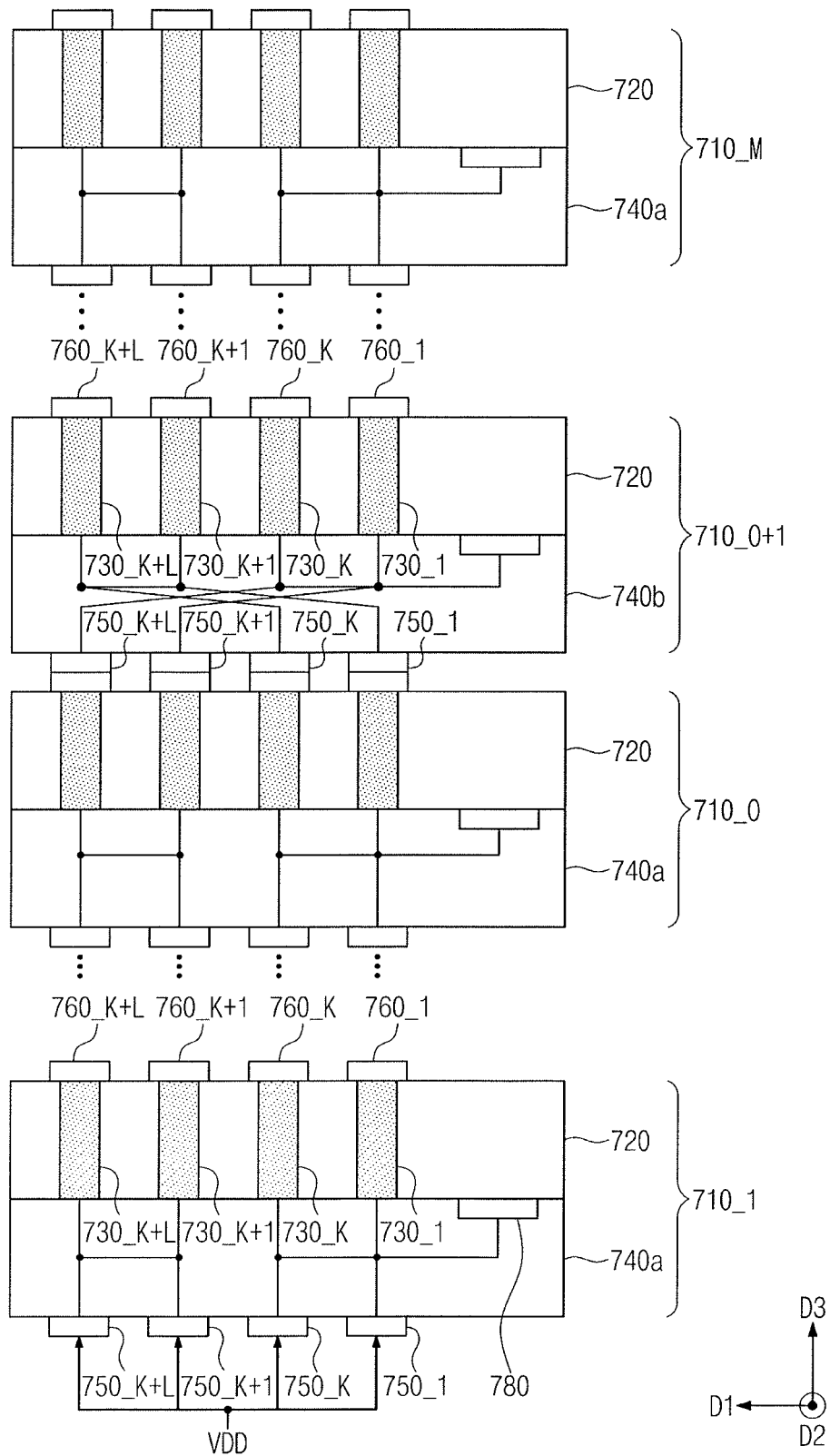
FIG. 8 illustrates a sectional view of a semiconductor device according to an embodiment.

FIG. 8 is a sectional view illustrating a semiconductor device according to an embodiment. FIG. 8 will be described with reference to FIG. 1. Below, a description will be given with respect to a difference between the semiconductor device 100 and a semiconductor device 700 of FIG. 8.

A semiconductor device 700 may include first to M-th semiconductor dies 710_1 to 710_M sequentially stacked in the direction D3. Here, "M" may be an integer of 2 or more. Below, the first semiconductor die 710_1 will be described.

The first semiconductor die 710_1 may include a substrate 720, first to K-th through silicon vias 730_1 to 730_K, (K+1)-th to (K+L)-th through silicon vias 730_K+1 to 730_K+L, a first interconnection layer 740a, first to K-th lower terminals 750_1 to 750_K, (K+1)-th to (K+L)-th lower terminals 750_K+1 to 750_K+L, first to K-th upper terminals 760_1 to 760_K, (K+1)-th to (K+L)-th upper terminals 760_K+1 to 760_K+L, and a circuit 780. Here, each of "K" and "L" may be an integer of 2 or more, and "K" and "L" may be identical to or different from each other. The substrate 720 and the circuit 780 may be manufactured substantially the same as the substrate 120 and the circuit 180 of FIG. 1.

The first to K-th lower terminals 750_1 to 750_K may be electrically connected to the first to K-th through silicon vias 730_1 to 730_K through the interconnection layer 740. The (K+1)-th to (K+L)-th lower terminals 750_K+1 to 750_K+L may be electrically connected to the (K+1)-th to (K+L)-th through silicon vias 730_K+1 to 730_K+L through the interconnection layer 740. Each of the first to (K+L)-th upper terminals 760_1 to 760_K+L may be electrically connected to a through silicon via of the first to (K+L)-th through silicon vias 730_1 to 730_K+L, which overlaps each of the first to (K+L)-th upper terminals 760_1 to 760_K+L in the plan view.

The circuit 780 may be supplied or provided with VDD through a power supply line electrically connected to the first to K-th through silicon vias 730_1 to 730_K. For example, a power supply line connected to the first to K-th through silicon vias 730_1 to 730_K may not be electrically connected to the (K+1)-th to (K+L)-th through silicon vias 730_K+1 to 730_K+L.

Next, the (O+1)-th semiconductor die 710_O+1 will be described. Here, "O" may be an integer that is not less than 1 and is not more than "M−1". The (O+1)-th semiconductor die 710_O+1 may be different from the first semiconductor die 710_1. The (O+1)-th semiconductor die 710_O+1 may include the substrate 720, first to K-th through silicon vias 730_1 to 730_K, (K+1)-th to (K+L)-th through silicon vias 730_K+1 to 730_K+L, a second interconnection layer 740b, first to K-th lower terminals 750_1 to 750_K, (K+1)-th to (K+L)-th lower terminals 750_K+1 to 750_K+L, first to K-th upper terminals 760_1 to 760_K, (K+1)-th to (K+L)-th upper terminals 760_K+1 to 760_K+L, and a circuit 780.

In the (O+1)-th semiconductor die 710_O+1, the first to K-th lower terminals 750_1 to 750_K may be electrically connected to the (K+1)-th to (K+L)-th through silicon vias 730_K+1 to 730_K+L, which do not overlap the first to K-th lower terminals 750_1 to 750_K in the plan view, through the second interconnection layer 740b. The (K+1)-th to (K+L)-th lower terminals 750_K+1 to 750_K+L may be electrically connected to the first to K-th through silicon vias 730_1 to 730_K, which do not overlap the (K+1)-th to (K+L)-th lower terminals 750_K+1 to 750_K+L in the plan view, through the second interconnection layer 740b. Each of the first to (K+L)-th upper terminals 760_1 to 760_K+L may be electrically connected to a through silicon via of the first to (K+L)-th through silicon vias 730_1 to 730_K+L of the (O+2)-th semiconductor die 710_O+2 (not illustrated), which overlaps each of the first to (K+L)-th upper terminals 760_1 to 760_K+L in the plan view.

The (O+1)-th semiconductor die 710_O+1 may be stacked on the O-th semiconductor die 710_O. The first to K-th through silicon vias of the O-th semiconductor die 710_O may be electrically connected to the (K+1)-th to (K+L)-th through silicon via 730_K+1 to 730_K+L of the (O+1)-th semiconductor die 710_O+1, which do not overlap the first to K-th through silicon vias of the O-th semiconductor die 710_O in the plan view. In other words, each of first to K-th through silicon vias of the O-th semiconductor die 710_O may be electrically connected to a through silicon via of the (O+1)-th semiconductor die 710_O+1, that is spaced apart therefrom in the plan view. The (K+1)-th to (K+L)-th through silicon vias of the O-th semiconductor die 710_O may be electrically connected to the first to K-th through silicon vias 730_1 to 730K of the (O+1)-th semiconductor die 710_O1, which do not overlap the (K+1)-th to (K+L)-th through silicon vias of the O-th semiconductor die 710_O in the plan view.

In an embodiment, the first to O-th semiconductor dies 710_1 to 710_O and the (O+2)-th to M-th semiconductor dies 710_O+2 to 710_M may be substantially identically manufactured. For example, "N" may be an integer that is not less than 1 and is not more than "M−1", and may be different from "O". The (N+1)-th semiconductor die may be stacked on the N-th semiconductor die (any one of the first to (O−1)-th and the (O+1)-th to (M−1)-th semiconductor dies 710_1 to 710_O−1 and 710_O+1 to 710_M). Each of first to (K+L)-th through silicon vias of the N-th semiconductor die may be electrically connected to a through silicon via of first to (K+L)-th through silicon vias of the (N+1)-th semiconductor die, which overlaps each of first to (K+L)-th through silicon vias of the N-th semiconductor die in the plan view.

According to an embodiment, a current for supplying VDD to the (O+1)-th to M-th semiconductor dies 710_O+1 to 710_M may flow through the (K+1)-th to (K+L)-th through silicon vias of the first to O-th semiconductor dies 710_1 to 710_O, on which the (O+1)-th semiconductor die 710_O+1 is stacked. A current for supplying VDD to the second to O-th semiconductor dies 710_2 to 710_O may flow through the first to K-th through silicon vias of the first to O-th semiconductor dies 710_1 to 710_O, on which the (O+1)-th semiconductor die 710_O+1 is stacked. That is, a current for supplying VDD to the second to M-th semiconductor dies 710_2 to 710_M may be distributed by the interconnection layer 740 of the (O+1)-th semiconductor die 710_O+1. Only one (O+1)-th semiconductor die 710_O+1 is illustrated in FIG. 8, but multiples of (O+1)-th semiconductor dies 710_O+1 may be included throughout the stack.

Figure 9:
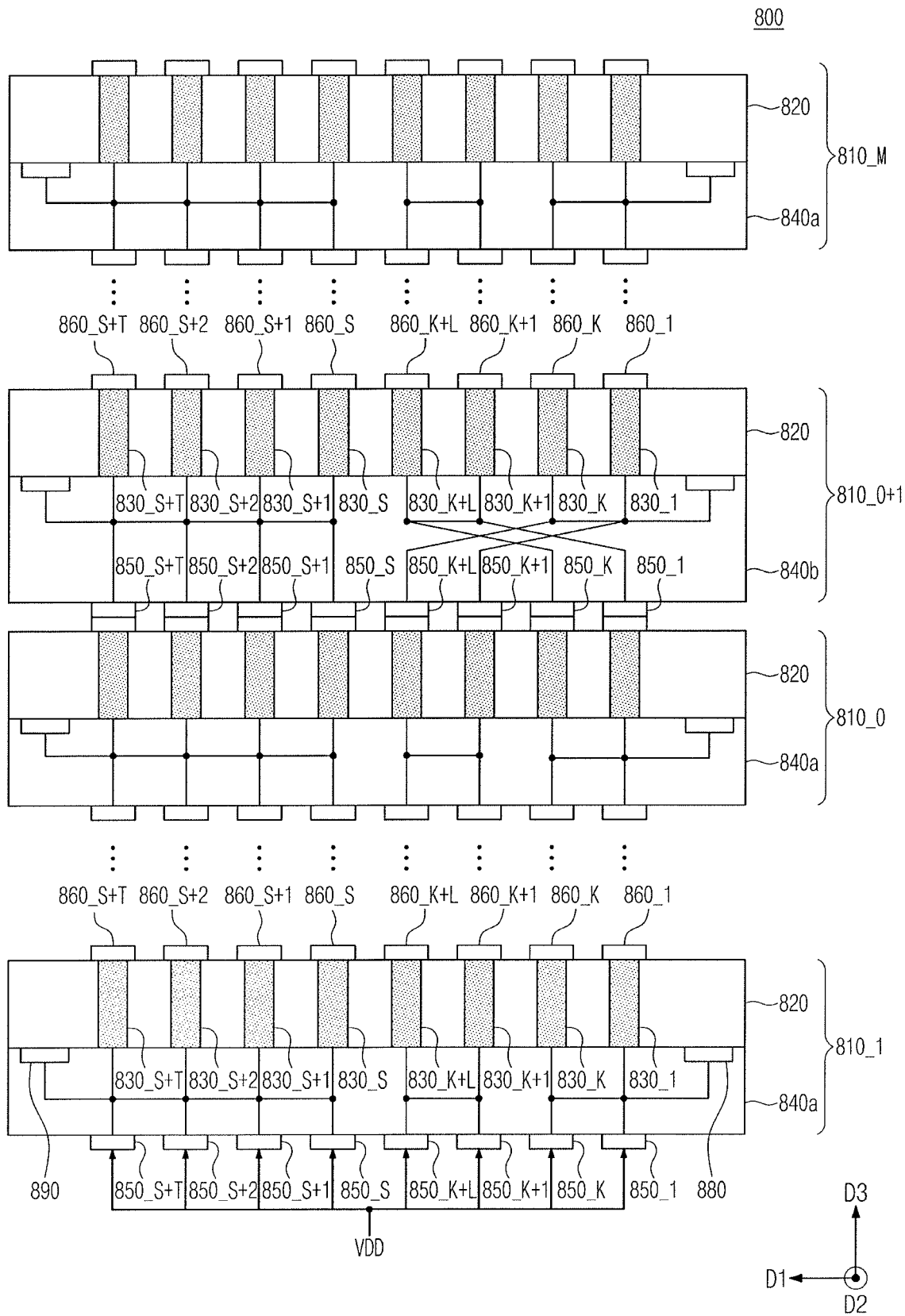
FIG. 9 illustrates a sectional view of another example of a semiconductor device of FIG. 8.

FIG. 9 is a sectional view illustrating another example of a semiconductor device of FIG. 8. FIG. 9 will be described with reference to FIGS. 4 and 8. Below, a description will be given with respect to differences between the semiconductor device 700 of FIG. 8 and a semiconductor device 800 of FIG. 9.

The semiconductor device 800 may include first to M-th semiconductor dies 810_1 to 810_M sequentially stacked in the direction D3. The first to O-th semiconductor dies 810_1 to 810_O and the (O+2)-th to M-th semiconductor dies 810_O+2 to 810_M may be substantially identically manufactured.

Each of the first and O-th semiconductor dies 810_1 to 810_O may include a substrate 820, first to (K+L)-th through silicon vias 830_1 to 830_K+L, S-th to (S+T)-th through silicon vias 830_S to 830_S+T, a first interconnection layer 840a, first to (K+L)-th lower terminals 850_1 to 850_K+L, S-th to (S+T)-th lower terminals 850_S to 850_S+T, first to (K+L)-th upper terminals 860_1 to 860_K+L, S-th to (S+T)-th upper terminals 860_S to 860_S+T, a first circuit 880, and a second circuit 890. The (O+1)-th semiconductor dies 810_O+1 may include a substrate 820, first to (K+L)-th through silicon vias 830_1 to 830_K+L, S-th to (S+T)-th through silicon vias 830_S to 830_S+T, a second interconnection layer 840b, first to (K+L)-th lower terminals 850_1 to 850_K+L, S-th to (S+T)-th lower terminals 850_S to 850_S+T, first to (K+L)-th upper terminals 860_1 to 860_K+L, S-th to (S+T)-th upper terminals 860_S to 860_S+T, a first circuit 880, and a second circuit 890.

The substrate 820, the first to (K+L)-th through silicon vias 830_1 to 830_K+L, the first interconnection layer 840a, the first to (K+L)-th lower terminals 850_1 to 850_K+L, the first to (K+L)-th upper terminals 860_1 to 860_K+L, and the first circuit 880 of the first semiconductor die 810_1 may be manufactured substantially the same as the components 720, 730_1 to 730_K+L, 740, 750_1 to 750_K+L, 760_1 to 760_K+L, and 780 of the first semiconductor die 710_1 described with reference to FIG. 8.

The substrate 820, the first to (K+L)-th through silicon vias 830_1 to 830_K+L, the second interconnection layer 840b, the first to (K+L)-th lower terminals 850_1 to 850_K+L, the first to (K+L)-th upper terminals 860_1 to 860_K+L, and the first circuit 880 of the (O+1)-th semiconductor die 810_O+1 may be manufactured substantially the same as the components 720, 730_1 to 730_K+L, 740, 750_1 to 750_K+L, 760_1 to 760_K+L, and 780 of the (O+1)-th semiconductor die 710_O+1 described with reference to FIG. 8.

The S-th to (S+T)-th through silicon vias 830_S to 830_S+T, the S-th to (S+T)-th lower terminals 850_S to 850_S+T, the S-th to (S+T)-th upper terminals 860_S to 860_S+T, and the second circuit 890 of each of the first to M-th semiconductor dies 810_1 to 810_M may be manufactured substantially the same as the components 330_K+1 to 330_K+L, 350_K+1 to 350_K+L, 360_K+1 to 360_K+L, and 390 of the first semiconductor die 310_1 described with reference to FIG. 4.

Figure 10:
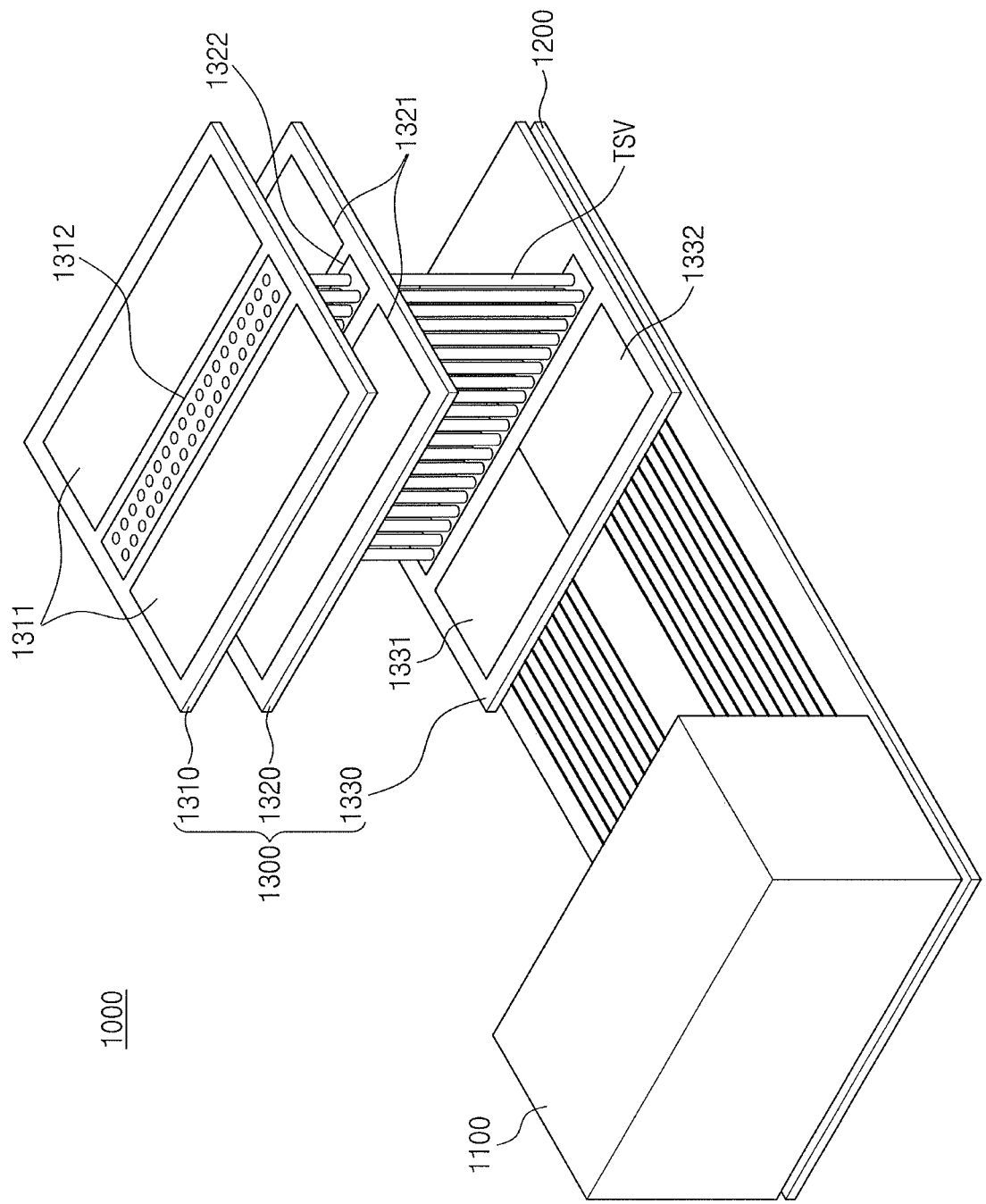
FIG. 10 illustrates a view of an electronic device to which a semiconductor device according to an embodiment is applied.

FIG. 10 is a view illustrating an electronic device to which a semiconductor device according to an embodiment is applied. An electronic device 1000 may include a system on chip (SoC) 1100, a substrate 1200, and a semiconductor device 1300. In FIG. 10, the semiconductor device 1300 may be used as a memory device.

The SoC 1100 that is an application processor (AP) may control overall operations of the electronic device 1000. The SoC 1100 may execute a program according to an application that the electronic device 1000 supports and may receive data associated with program execution from the semiconductor device 1300 or may transmit a result of the program execution to the semiconductor device 1300. The SoC 1100 may be on a first surface of the substrate 1200, and solder balls or bumps may be between the first surface of the substrate 1200 and the SoC 1100 to electrically connect the substrate 1200 and the SoC 1100.

The substrate 1200 may provide an input/output path between the SoC 1100 and the semiconductor device 1300. For example, the substrate 1200 may be a printed circuit board, a flexible circuit board, a ceramic substrate, an interposer, or the like. When the substrate 1200 is an interposer, the substrate 1200 may be manufactured by using a silicon wafer. Referring to FIG. 10, a plurality of interconnections may be formed within the substrate 1200.

The semiconductor device 1300 may include a plurality of memory dies stacked in a vertical direction. For example, the semiconductor device 1300 may be a high bandwidth memory (I-IBM) device providing data input/output with a high bandwidth. The semiconductor device 1300 may be on the first surface of the substrate 1200, on which the SoC 1100 is located. Solder balls or bumps may be between the first surface of the substrate 1200 and the semiconductor device 1300 to electrically connect the semiconductor device 1300 and the substrate 120. The semiconductor device 1300 may include a first semiconductor die 1310, a second semiconductor die 1320, and a buffer die 1330. For convenience of description, only two semiconductor dies are illustrated in FIG. 10.

The first semiconductor die 1310 may include a first circuit region 1311 and a first through silicon via region 1312. The second semiconductor die 1320 may include a second circuit region 1321 and a second through silicon via region 1322. The first circuit and/or the second circuit described with reference to FIGS. 1 and 3 to 9 may be in each of the first and second circuit regions 1311 and 1322. The through silicon vias described with reference to FIGS. 1 and 3 to 9 may be in each of the first and second through silicon via regions 1312 and 1322. Each of the first and second semiconductor dies 1310 and 1320 may be any one of the semiconductor dies described with reference to FIGS. 1 and 3 to 9.

The buffer die 1330 may be connected to the first through silicon via region 1312 and the second through silicon via region 1322 via the through silicon vias. The buffer die 1330 may supply or provide VDD to the first and second semiconductor dies 1310 and 1320 via the through silicon vias. The buffer die 1330 may receive data from the outside and may transmit the received data to the first and second semiconductor dies 1310 and 1320 via the through silicon vias. The buffer die 1330 may receive data stored in the first and second semiconductor dies 1310 and 1320 via the through silicon vias and may output the received data to the outside. The buffer die 1330 may include first and second buffer circuits 1331 and 1332 for driving the first and second semiconductor dies 1310 and 1320, respectively.

Figure 11:
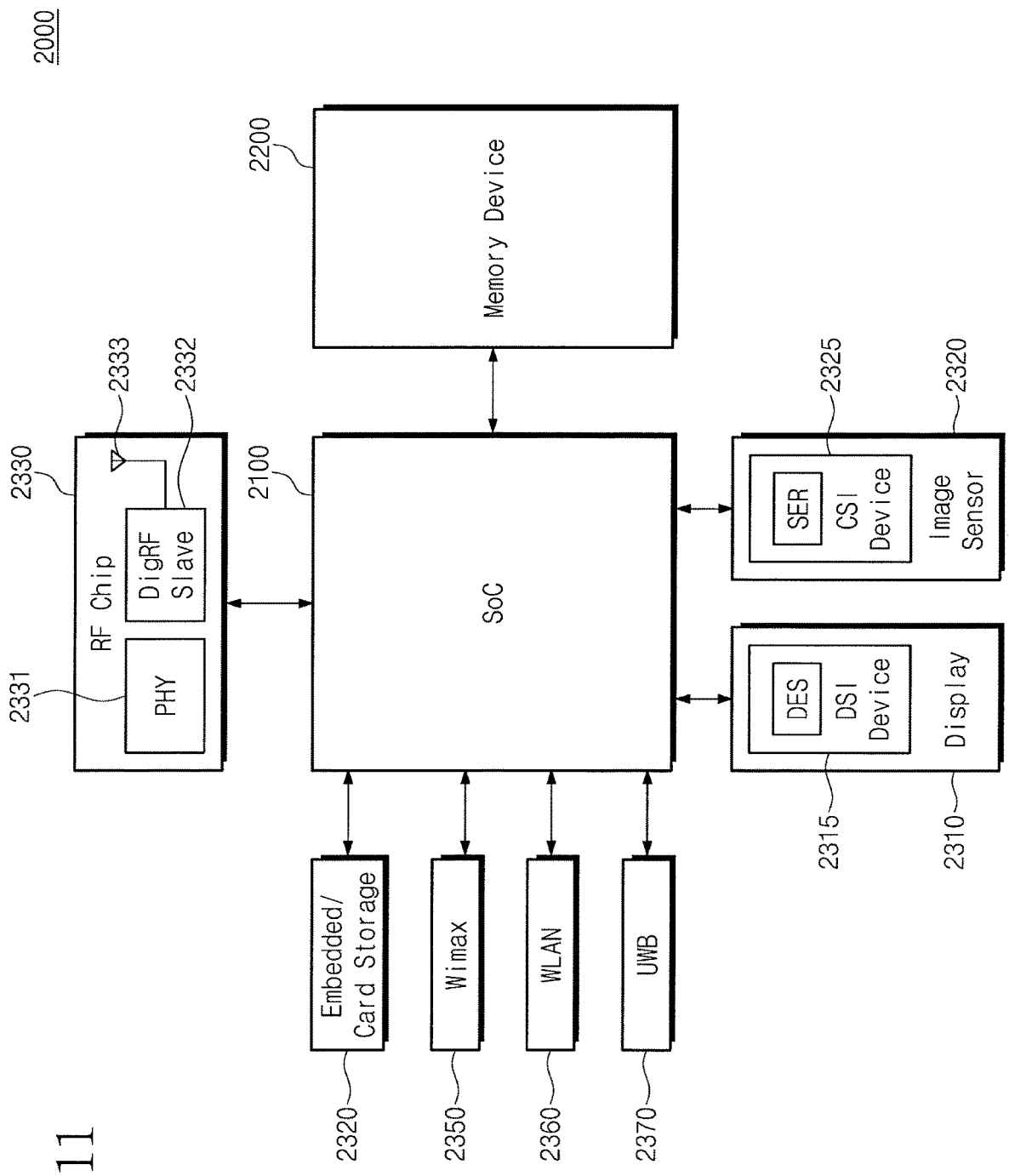
FIG. 11 illustrates a block diagram of another electronic device to which a semiconductor device according to an embodiment is applied.

FIG. 11 is a block diagram illustrating another electronic device to which a semiconductor device according to an embodiment is applied. An electronic device 2000 may be implemented with an electronic device that may use or support interfaces proposed by mobile industry processor interface (MIPI) alliance. For example, the electronic device 2000 may be, but is not limited to, one of a server, a computer, a smartphone, a tablet, personal digital assistant (PDA), a digital camera, a portable multimedia player (PMP), a wearable device, an Internet of Things (IoT) device, and the like.

The electronic device 2000 may include a SoC 2100 and a memory device 2200. The SoC 2100 may be an application processor. The memory device 2200 may be any one of the semiconductor devices 100 to 800 described with reference to FIGS. 1 to 9.

The electronic device 2000 may include a display 2310 communicating with the SoC 2100. The SoC 2100 may communicate with a display serial interface (DSI) device 2315 through an DSI. For example, an optical deserializer DES may be implemented in the DSI device 2315.

The electronic device 2000 may include an image sensor 2320 communicating with the SoC 2100. The SoC 2100 may communicate with a camera serial interface (CSI) device 2325 through a CSI. For example, an optical serializer SER may be implemented in the CSI device 2325.

The electronic device 2000 may further include a radio frequency (RF) chip 2330 that communicates with the SoC 2100. The RF chip 2330 may include a physical layer 2331, a DigRF slave 2332, and an antenna 2333. For example, the physical layer 2331 of the RF chip 2330 and the SoC 2100 may exchange data with each other through a DigRF interface proposed by the MIPI alliance.

The electronic device 2000 may further include embedded/card storage 2340. The embedded/card storage 2340 may store data provided from the SoC 2100 and may permanently store data provided from the memory device 2200. The electronic device 2000 may communicate with an external system through worldwide interoperability for microwave access (WiMAX) 2350, a wireless local area network (WLAN) 2360, ultra-wide band (UWB) 2370, and the like.

By way of summation and review, if through silicon vias are simply increased to accommodate an increase in a number of stacked semiconductor dies, a current may increase on through silicon vias adjacent to a circuit consuming power or in a relatively lower layer (or a bottom layer). When a current flowing via a certain through silicon via increases, the lifespan of the through silicon via may decrease, and the phenomenon of electromigration may occur.

In contrast, a semiconductor device according to an embodiment may generate a current that flows uniformly through each of through silicon vias for providing a supply voltage to semiconductor dies. According to an embodiment, the lifespan of a through silicon via may be improved, and the phenomenon of electromigration may be reduced or prevented.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   first to M-th semiconductor dies stacked in a first direction, each of the first to M-th semiconductor dies including:
   a substrate;
   an interconnection layer under the substrate;
   first to K-th through silicon vias passing through the substrate in the first direction, wherein each of "M" and "K" is independently an integer of 2 or more;

first to K-th terminals under the first to K-th through silicon vias, respectively; and a first circuit provided with a voltage and a current through a power supply line electrically connected to the first through silicon via of the first to K-th through silicon vias and to the second terminal of the first to K-th terminals, the first circuit being different from the interconnection layer, wherein an (N+1)-th semiconductor die of the first to M-th semiconductor dies is stacked on an N-th semiconductor die of the first to M-th semiconductor dies, "N" being an integer that is not less than 1 and is not more than (M−1), wherein each of first to K-th through silicon vias of the N-th semiconductor die is electrically connected to a through silicon via of first to K-th through silicon vias of the (N+1)-th semiconductor die, which does not overlap each of the first to K-th through silicon vias of the N-th semiconductor die in a plan view, and wherein the first to K-th through silicon vias of the first semiconductor die are each connected to a power source supplying the voltage and the current through a non-overlapping one of the first to K-th terminals.

2. The semiconductor device as claimed in claim 1, wherein:

the first through silicon via of the N-th semiconductor die is electrically connected to the K-th through silicon via of the (N+1)-th semiconductor die, and the second to K-th through silicon vias of the N-th semiconductor die are electrically connected to the first to (K−1)-th through silicon vias of the (N+1)-th semiconductor die, respectively.

3. The semiconductor device as claimed in claim 1, wherein the first circuit of each of the first to M-th semiconductor dies is electrically directly connected only to the first through silicon via of the first to K-th through silicon vias and only to the second terminal of the first to K-th terminals in each of the first to M-th semiconductor dies.

4. The semiconductor device as claimed in claim 1, wherein:

the first to K-th through silicon vias of each of the first to M-th semiconductor dies are divided into first to G-th groups, "G" being an integer that is not less than 2 and is not more than (K−1), and through silicon vias included in each of the first to G-th groups are electrically connected to each other.

5. The semiconductor device as claimed in claim 4, wherein the first circuit and the power supply line are electrically connected to a group of the first to G-th groups, which include the first through silicon via of each of the first to M-th semiconductor dies.

6. The semiconductor device as claimed in claim 4, wherein a number of the through silicon vias included in each of the first to G-th groups is at least two.

7. The semiconductor device as claimed in claim 6, wherein a number of through silicon vias included in the first group is different from a number of through silicon vias included in the second group.

8. The semiconductor device as claimed in claim 1, wherein:

each of the first to M-th semiconductor dies further includes:

(K+1)-th to (K+L)-th through silicon vias passing through the substrate in the first direction; and a second circuit to receive the power through a power supply line electrically connected to the (K+1)-th to (K+L)-th through silicon vias, the (K+1)-th to (K+L)-th through silicon vias of the N-th semiconductor die are electrically connected to (K+1)-th to (K+L)-th through silicon vias of the (N+1)-th semiconductor die, which overlap the (K+1)-th to (K+L)-th through silicon vias of the N-th semiconductor die in the plan view, and the (K+1)-th to (K+L)-th through silicon vias of the first semiconductor die are connected to the power source.

9. A semiconductor device, comprising:

first to M-th semiconductor dies stacked in a first direction, each of the first to M-th semiconductor dies including:

a substrate;

first to K-th through silicon vias passing through the substrate in the first direction;

first to S-th switches to select power supply lines to be electrically connected to the first to K-th through silicon vias; and a first circuit provided with a voltage and a current through one of the first to S-th switches, wherein each of "M", "K", and "S" is independently an integer of 2 or more;

wherein an (N±1)-th semiconductor die of the first to M-th semiconductor dies is stacked on an N-th semiconductor die of the first to M-th semiconductor dies, "N" being an integer that is not less than 1 and is not more than (M−1), wherein each of first to K-th through silicon vias of the N-th semiconductor die is electrically connected to a through silicon via of first to K-th through silicon vias of the (N±1)-th semiconductor die, which overlaps each of the first to K-th through silicon vias of the N-th semiconductor die in a plan view, and wherein first to K-th through silicon vias of the first semiconductor die are connected to a power source supplying the voltage and the current.

10. The semiconductor device as claimed in claim 9, wherein:

"K" equals "S", each of the power supply lines is electrically connected to one of the first to K-th through silicon vias of each of the first to M-th semiconductor dies and one of the first to S-th switches, and a through silicon via electrically connected to a first circuit of the N-th semiconductor die through one of first to S-th switches of the N-th semiconductor die is not electrically connected to a through silicon via electrically connected to the first circuit of the (N+1)-th semiconductor die through one of the first to S-th switches of the (N+1)-th semiconductor die.

11. The semiconductor device as claimed in claim 10, wherein a length of a power supply line electrically connected to the first circuit of the (N+1)-th semiconductor die is shorter than a length of a power supply line electrically connected to the first circuit of the N-th semiconductor die.

12. The semiconductor device as claimed in claim 9, wherein the first to S-th switches of each of the first to M-th semiconductor dies select the power supply lines based on stack identifiers of the first to M-th semiconductor dies.

13. The semiconductor device as claimed in claim 9, wherein, the first to S-th switches of each of the first to M-th semiconductor dies select the power supply lines based on an operating mode of the first circuit.

14. The semiconductor device as claimed in claim 9, wherein:
- the first to K-th through silicon vias of each of the first to M-th semiconductor dies are divided into first to G-th groups, "G" being an integer that is not less than 2 and is not more than (K−1),
- through silicon vias included in each of the first to G-th groups are electrically connected to each other, and
- each of the power supply lines is electrically connected to the through silicon vias included in each of the first to G-th groups and one of the first to S-th switches, "G" being identical to "S".

15. The semiconductor device as claimed in claim 14, wherein a number of through silicon vias included in the first group is different from a number of through silicon vias included in the second group.

16. The semiconductor device as claimed in claim 9, wherein each of the first to M-th semiconductor dies further includes:
- (K+1)-th to (K+L)-th through silicon vias passing through the substrate in the first direction; and
- a second circuit to receive the power through a power supply line electrically connected to the (K+1)-th to (K+L)-th through silicon vias,
- wherein (K+1)-th to (K+L)-th through silicon vias of the N-th semiconductor die are electrically connected to (K+1)-th to (K+L)-th through silicon vias of the (N+1)-th semiconductor die, which overlap the (K+1)-th to (K+L)-th through silicon vias of the N-th semiconductor die in the plan view.

17. A semiconductor device, comprising:
- first to M-th semiconductor dies stacked in a first direction, each of the first to M-th semiconductor dies including:
  - a substrate;
  - first to K-th through silicon vias passing through the substrate in the first direction;
  - (K+1)-th to (K+L)-th through silicon vias passing through the substrate in the first direction; and
  - a first circuit provided with a voltage and a current through a power supply line electrically connected to the first to K-th through silicon vias, wherein each of "M", "K", and "L" is independently an integer of 2 or more,
- wherein an (O+1)-th semiconductor die of the first to M-th semiconductor dies is stacked on an O-th semiconductor die of the first to M-th semiconductor dies, "O" being an integer that is not less than 1 and is not more than (M−1),
- wherein first to K-th through silicon vias of the O-th semiconductor die are electrically connected to (K+1)-th to (K+L) through silicon vias of the (O+1)-th semiconductor die, which do not overlap the first to K-th through silicon vias of the O-th semiconductor die in a plan view, and (K+1)-th to (K+L)-th through silicon vias of the O-th semiconductor die are electrically connected to first to K-th through silicon vias of the (O+1)-th semiconductor die, which do not overlap (K+1)-th to (K+L)-th through silicon vias of the O-th semiconductor die in the plan view,
- wherein an (N+1)-th semiconductor die of the first to M-th semiconductor dies is stacked on an N-th semiconductor die of the first to M-th semiconductor dies, "N" being an integer that is not less than 1 and is not more than (M−1) and being different from "O",
- wherein each of first to (K+L)-th through silicon vias of the N-th semiconductor die is electrically connected to a through silicon via of first to (K+L)-th through silicon vias of the (N+1)-th semiconductor die, which overlaps each of the first to (K+L)-th through silicon vias of the N-th semiconductor in the plan view, and
- wherein first to (K+L)-th through silicon vias of the first semiconductor die are connected to a power source supplying the power.

18. The semiconductor device as claimed in claim 17, wherein the first circuit of each of the first to M-th semiconductor dies is not electrically connected to the (K+1)-th to (K+L)-th through silicon vias of each of the first to M-th semiconductor dies.

19. The semiconductor device as claimed in claim 17, wherein the first to O-th semiconductor dies and the (O+2)-th to M-th semiconductor dies are identically manufactured.

20. The semiconductor device as claimed in claim 17, wherein each of the first to M-th semiconductor dies further includes:
- S-th to (S+T)-th through silicon vias passing through the substrate in the first direction; and
- a second circuit to receive the power through a power supply line electrically connected to the S-th to (S+T)-th through silicon vias,
- wherein S-th to (S+T)-th through silicon vias of the O-th semiconductor die are electrically connected to S-th to (S+T)-th through silicon vias of the (O+1)-th semiconductor die, which overlap the S-th to (S+T)-th through silicon vias of the O-th semiconductor die in the plan view,
- wherein S-th to (S+T)-th through silicon vias of the N-th semiconductor die are electrically connected to S-th to (S+T)-th through silicon vias of the (N+1)-th semiconductor die, which overlap the S-th to (S+T)-th through silicon vias of the N-th semiconductor die in the plan view, and
- wherein S-th to (S+T)-th through silicon vias of the first semiconductor die are connected to the power source.

* * * * *